United States Patent
Lee et al.

(10) Patent No.: US 11,661,332 B2
(45) Date of Patent: May 30, 2023

(54) STICTION REDUCTION SYSTEM AND METHOD THEREOF

(71) Applicant: InvenSense, Inc., San Jose, CA (US)

(72) Inventors: Daesung Lee, San Jose, CA (US); Ian Flader, Redwood City, CA (US); Alan Cuthbertson, San Jose, CA (US); Emad Mehdizadeh, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/795,514

(22) Filed: Feb. 19, 2020

(65) Prior Publication Data

US 2020/0262697 A1    Aug. 20, 2020

Related U.S. Application Data

(60) Provisional application No. 62/825,585, filed on Mar. 28, 2019, provisional application No. 62/807,865, filed on Feb. 20, 2019, provisional application No. 62/807,867, filed on Feb. 20, 2019.

(51) Int. Cl.
| | |
|---|---|
| *H01L 21/311* | (2006.01) |
| *B81B 3/00* | (2006.01) |
| *B81C 1/00* | (2006.01) |

(52) U.S. Cl.
CPC ............ *B81B 3/001* (2013.01); *B81C 1/0092* (2013.01); *B81C 1/0096* (2013.01); *B81C 1/00341* (2013.01); *B81C 1/00444* (2013.01); *B81B 2201/0235* (2013.01); *B81B 2201/0242* (2013.01); *B81C 2201/013* (2013.01); *B81C 2201/115* (2013.01)

(58) Field of Classification Search
CPC ................... H01L 21/30625; H01L 21/31144
See application file for complete search history.

(56) References Cited

U.S. PATENT DOCUMENTS

| 6,121,150 A | * | 9/2000 | Avanzino | .......... H01L 21/31144 |
| | | | | 216/38 |
| 9,611,133 B2 | | 4/2017 | Lu et al. | |

(Continued)

OTHER PUBLICATIONS

Wolf et al., "Silicon Processing for the VLSI Era, vol. 1—Process Technology", Lattice Press, California, 1986, pp. 521-535.*

*Primary Examiner* — Thomas T Pham

(57) ABSTRACT

Methods and systems for reducing stiction through roughening the surface and reducing the contact area in MEMS devices are disclosed. A method includes fabricating bumpstops on a surface of a MEMS device substrate to reduce stiction. Another method is directed to applying roughening etchant to a surface of a silicon substrate to enhance roughness after cavity etch and before removal of hardmask. Another embodiment described herein is directed to a method to reduce contact area between proof mass and UCAV ("upper cavity") substrate surface with minimal impact on the cavity volume by introducing a shallow etch process step and maintaining high pressure in accelerometer cavity. Another method is described as to increasing the surface roughness of a UCAV substrate surface by depositing a rough layer (e.g. polysilicon) on the surface of the substrate and etching back the rough layer to transfer the roughness.

10 Claims, 22 Drawing Sheets

(56) References Cited

U.S. PATENT DOCUMENTS

| | | | |
|---|---|---|---|
| 2003/0082795 A1* | 5/2003 | Shuler | C12M 41/46 |
| | | | 435/286.1 |
| 2006/0180897 A1* | 8/2006 | Park | H03H 9/1057 |
| | | | 257/619 |
| 2007/0039387 A1* | 2/2007 | Jouanet | H01H 35/14 |
| | | | 73/510 |
| 2009/0124089 A1* | 5/2009 | Brencher | H01L 21/32136 |
| | | | 156/345.1 |
| 2014/0260613 A1 | 9/2014 | Qiu et al. | |
| 2014/0264655 A1 | 9/2014 | Williams et al. | |
| 2014/0319350 A1* | 10/2014 | Yon | G01J 5/20 |
| | | | 250/338.4 |
| 2015/0303226 A1* | 10/2015 | Kurihara | H01L 27/14643 |
| | | | 257/432 |
| 2016/0351495 A1* | 12/2016 | Paolillo | H01L 21/76819 |
| 2017/0305738 A1* | 10/2017 | Chang | B81B 3/0005 |

* cited by examiner

STICTION REDUCTION SYSTEM AND METHOD THEREOF

CROSS-REFERENCE TO RELATED APPLICATIONS

This application claims the benefit and priority to the U.S. Provisional Patent Application Ser. No. 62/807,865 filed Feb. 20, 2019, entitled "METHOD OF FORMING ROUGH CAVITY;" U.S. Provisional Patent Application Ser. No. 62/807,867 filed Feb. 20, 2019, entitled "METHOD OF FORMING BUMPSTOP ON MEMS DEVICE;" and U.S. Provisional Patent Application Ser. No. 62/825,585 filed Mar. 28, 2019, entitled "UCAV STICTION REDUCTION IN MOTION SENSOR;" which are incorporated herein by reference in their entirety.

BACKGROUND

MEMS ("micro-electro-mechanical systems") are a class of devices that are fabricated using semiconductor-like processes and exhibit mechanical characteristics. For example, MEMS devices may include the ability to move or deform. Stiction is a problem in MEMS due to their large surface area-to-volume ratio, as surface force becomes greater than gravity and inertia causing two or more components to stick to one another without releasing. In other words, stiction results in large surface adhesion since the restoring force cannot overcome the attractive interfacial forces caused by capillary and electrostatic forces. Stiction can occur during fabrication (release stiction) and/or in applications (in-use stiction). The surface adhesion and stiction adversely affect the reliability and long-term durability of MEMS devices.

SUMMARY

Accordingly, a need has arisen to reduce the adhesion and stiction in MEMS devices. Methods and systems for reducing stiction through roughening the surface and reducing the contact area in MEMS devices are disclosed.

In some embodiments, a method includes forming an oxide mask on a portion of a surface of a MEMS device substrate. The method further includes depositing a bumpstop material over the oxide mask and further over an exposed portion of the surface of the MEMS device substrate. The method in some embodiments includes etching the bumpstop material to expose the oxide mask. According to some embodiments, the method further includes removing the oxide mask to expose the portion of the surface of the substrate and the bumpstop material. In one illustrative embodiment, the method further includes fusion bonding the MEMS device substrate to a MEMS cap substrate.

In some embodiments, the MEMS device includes a MEMS accelerometer or a MEMS gyroscope. According to some embodiments, the bumpstop material includes one or more of polysilicon, dielectric, metal, and single crystal silicon. It is appreciated that the oxide mask may be removed through buffered oxide etch (BOE), concentrated hydrofluoric acid (HF), or Vapor phase HF.

In some embodiments, a MEMS device includes a MEMS device substrate and a cap substrate. The MEMS device further includes one or more bumpstops formed on the surface of the MEMS device substrate. According to some embodiments, the forming of the bumpstop includes forming an oxide mask on a portion of a surface of the MEMS device substrate. The forming of the bumpstop further includes depositing a bumpstop material over the oxide mask and further over an exposed portion of the surface of the MEMS device substrate. In one illustrative embodiment, the forming of the bumpstop includes etching the bumpstop material to expose the oxide mask. The forming of the bumpstop in some embodiments includes removing the oxide mask to expose the portion of the surface of the substrate and the bumpstop material. In some embodiments, the MEMS cap substrate is fusion bonded with the MEMS device substrate.

In some embodiments, the MEMS device substrate includes a MEMS accelerometer or a MEMS gyroscope. It is appreciated that the bumpstop material may include one or more of polysilicon, dielectric, metal, and single crystal silicon. According to some embodiments, the oxide mask is removed through buffered oxide etch (BOE), concentrated HF, or vapor phase HF.

In some embodiments, a method includes forming a hardmask on a first surface of a substrate. The method further includes forming a photoresist layer on at least one exposed portion on the first surface of the substrate. According to some embodiments, the method includes etching a first exposed portion of the first surface of the substrate, in which the first exposed portion is a portion of the first surface not covered by the photoresist or the hardmask. The method in some embodiments includes removing the photoresist layer. In one illustrative embodiment, the method includes etching a second exposed portion on the first surface of the substrate, in which the second exposed portion on the first surface of the substrate is not covered by the hardmask. In some embodiments, the method includes applying roughening etchant to the second exposed portion of the first surface of the substrate. It is appreciated that the hardmask is removed. According to some embodiments, the method includes forming a fusion bond oxide layer on the first surface of the substrate. The method in some embodiments further includes fusion bonding the substrate to a device substrate.

In some embodiments, the device substrate includes a MEMS accelerometer or a MEMS gyroscope. It is appreciated that the hardmask may be an oxide layer, silicon nitride, or metal. According to some embodiments, the roughening etchant includes one or more of xenon difluoride, sulfur hexafluoride ("SF6"), and potassium hydroxide ("KOH").

In some embodiments, a method includes forming a hardmask on a first surface of a substrate. The method further includes forming a photoresist layer on the hardmask and on at least one exposed portion on the first surface of the substrate. According to some embodiments, the method includes etching a first exposed portion of the first surface of the substrate, in which the first exposed portion is a portion of the first surface not covered by the photoresist or the hardmask. It is appreciated that the photoresist layer is removed. The method in some embodiments includes forming another photoresist layer on the hardmask and further selectively on an exposed portion of the substrate. In one illustrative embodiment, the method includes etching a second exposed portion on the first surface of the substrate, in which the second exposed portion on the first surface of the substrate is not covered by the another photoresist layer or the hardmask. In some embodiments, the method includes removing the another photoresist layer to expose the substrate and the hardmask. According to some embodiments, the method includes etching a third exposed portion of the first surface of the substrate, wherein the third exposed portion of the first surface is not covered by the hardmask. It is appreciated that the hardmask may be removed. In one illustrative embodiment, the methods includes forming a fusion bond oxide layer on the first surface of the substrate. The method in some embodiments further includes fusion bonding the substrate to a device substrate.

In some embodiments, before removing the hardmask, the method further includes forming a rough surface layer on the hardmask and the first surface of the substrate. The method may further include etching back the rough surface layer to transfer a roughness of the rough surface layer to the substrate. According to some embodiments, the rough surface layer comprises polysilicon. In some embodiments, the etching back is more than a sum of a thickness of the rough surface layer and a thickness of the hardmask.

According to some embodiments, before removing the hardmask, the method further includes applying roughening etchant to the third exposed portion of the first surface of the substrate. In some embodiments, the device substrate comprises a MEMS accelerometer or a MEMS gyroscope. In one illustrative embodiment, the method further includes forming a standoff on a surface of the device substrate opposite to a surface of the fusion bond.

In some embodiments, a method includes forming a hardmask on a first surface of a substrate. The method further includes forming a photoresist layer on at least one exposed portion on the first surface of the substrate. According to some embodiments, the method includes etching a first exposed portion of the first surface of the substrate, in which the first exposed portion is a portion of the first surface not covered by the photoresist or the hardmask. It is appreciated that the photoresist layer may be removed. The method in some embodiments includes etching a second exposed portion on the first surface of the substrate, wherein the second exposed portion on the first surface of the substrate is not covered by the hardmask. In one illustrative embodiment, the method includes forming a rough surface layer on the hardmask and the first surface of the substrate. In some embodiments, the method includes etching back the rough surface layer to transfer a roughness of the rough surface layer to the substrate. It is appreciated that the hardmask is removed. In one illustrative embodiment, the method includes forming a fusion bond oxide layer on the first surface of the substrate. The method in some embodiments further includes fusion bonding the substrate to a device substrate.

In some embodiments, the rough surface layer comprises polysilicon. According to some embodiments, the etching back is more than a sum of a thickness of the rough surface layer and a thickness of the hardmask. It is appreciated that the device substrate may include a MEMS accelerometer or a MEMS gyroscope.

These and other features and aspects of the concepts described herein may be better understood with reference to the following drawings, description, and appended claims.

DESCRIPTION

Figure 1:
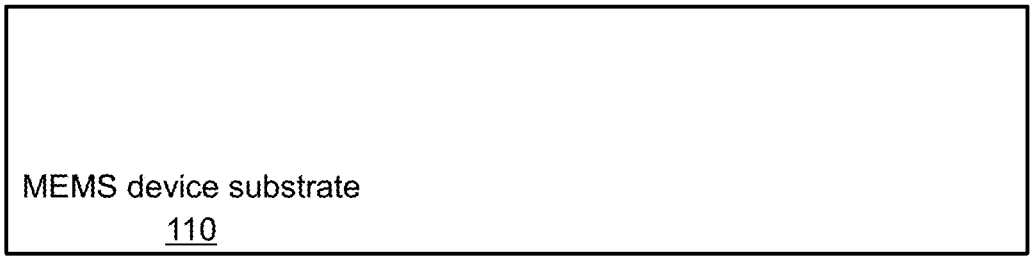
FIG. 1 shows a MEMS device substrate at an early stage of manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," "forming," "formation," "depositing," "removing," "removal," "reducing," "etching," "etching back," "fusion bonding," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

Stiction is an issue in MEMS devices, and there exists a need to reduce MEMS failure due to stiction. One embodiment described herein is directed to reducing the contact surface area of MEMS proof mass by engineering a MEMS device substrate prior to fusion bonding. Prior to fusion bonding, the MEMS device substrate has silicon oxide deposited and patterned. The oxide mask protects the silicon surface for fusion bonding. The bumpstop material is then deposited over the patterned oxide mask. The bumpstop material is then etched back, exposing the oxide mask underneath. The oxide mask is removed exposing the silicon for fusion bonding. It is appreciated that the silicon surface was protected, using the patterned oxide mask, from being degraded during bumpstop material deposition. Fabricating bumpstops on top of the MEMS device substrate reduces the occurrence of stiction to the cap without degrading the quality of silicon for fusion bonding.

Another embodiment described herein enhances the surface roughness of the MEMS encapsulation surface during engineering of the capping substrate. Engineered cavity substrates are prepared per motion process. After two steps of cavity etching, before removal of hardmask, a roughening etchant is used to enhance the silicon surface roughness. The enhanced roughness improves the MEMS performance by reducing stiction. Applying a surface roughening etchant independently and selectively controls the surface roughness of the MEMS cavity substrate.

Another embodiment described herein reduces the adhesion force between proof mass and UCAV ("Upper Cavity") surface in MEMS devices. In order to reduce stiction, the cavity depth may be increased such that proof mass movement does not make contact with the UCAV surface causing stiction. However, cavity depth controls the pressure in the cavity and increasing the cavity depth reduces pressure which adversely impacts performance of the accelerometer. In some embodiments, contact area between the proof mass and the UCAV surface is reduced with three etching process steps by adding a first step of shallow etching process before two cavity etching steps. Therefore, the contact area between proof mass and the UCAV surface is reduced while the volume of the accelerometer cavity does not increase much. In other words, stiction is reduced without adversely impacting the accelerometer performance by maintaining its cavity pressure. In some embodiments, the adhesion between the proof mass and the UCAV surface is reduced by increasing the surface roughness of the UCAV surface. The surface roughness of the UCAV surface may be increased by depositing a rough layer (e.g. polysilicon) on the hardmask and the surface of the substrate and etching back the rough layer to transfer the roughness to the UCAV cavity surface.

Another embodiment described herein enhances the surface roughness of the MEMS encapsulation surface during engineering of the cap substrate. Engineered cavity substrates are prepared per motion process. After two steps of cavity etching, before removal of hardmask, a rough layer (e.g. polysilicon) is deposited on the hardmask and is then etched back to transfer the roughness. The enhanced roughness improves the MEMS performance by reducing stiction. Depositing and then etching back a rough layer independently and selectively controls the surface roughness of the MEMS cavity substrate.

Referring now to FIG. 1, a MEMS device substrate at an early stage of manufacture according to one aspect of the present embodiments is shown. A MEMS device substrate 110 (Silicon substrate) is provided.

Figure 2:
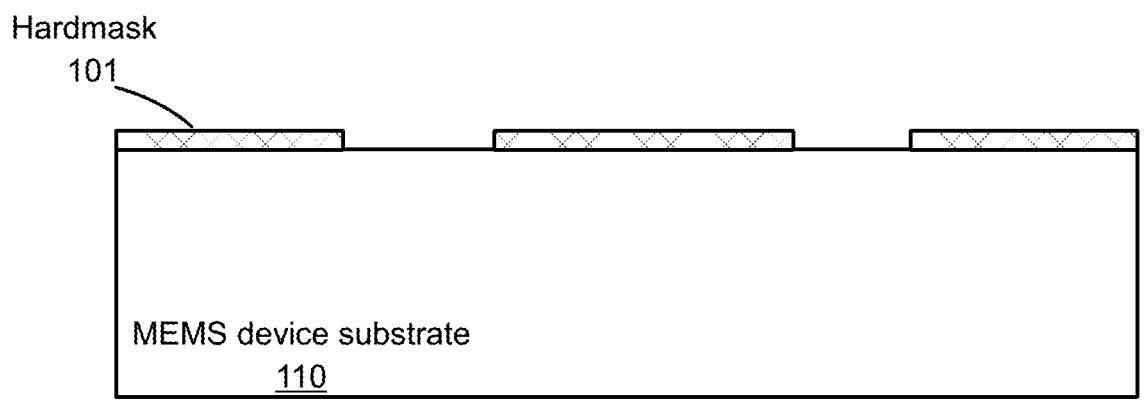
FIG. 2 shows formation of a hardmask on a portion of a surface of the MEMS device substrate according to one aspect of the present embodiments.

Referring now to FIG. 2, formation of a hardmask on a portion of a surface of the MEMS device substrate according to one aspect of the present embodiments is shown. The hardmask 101 is formed on a surface of the MEMS device substrate 110. The hardmask 101 may be an oxide hardmask, a nitride hardmask, a metal hardmask, or a photoresist mask. The hardmask 101 may be patterned. Accordingly, certain portions of the surface of the substrate 110 is exposed while other portions of the surface is covered by the hardmask 101.

Figure 3:
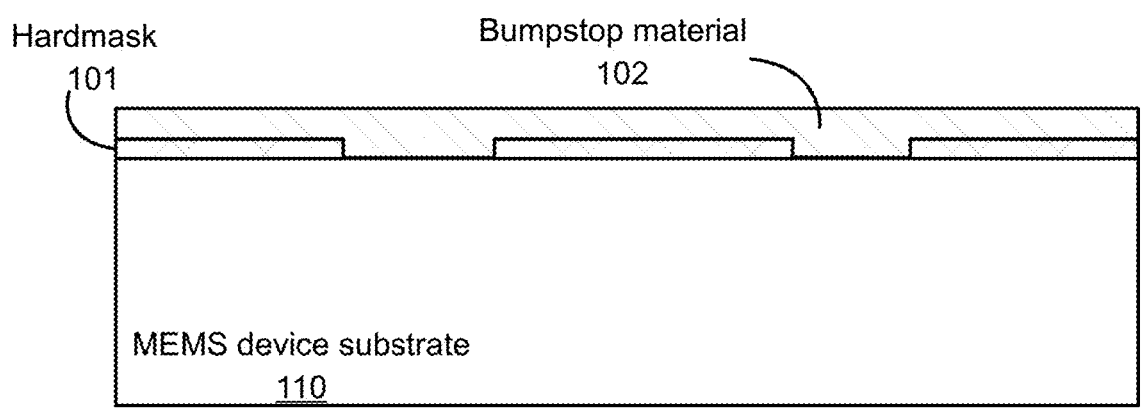
FIG. 3 shows deposition of bumpstop material over the hardmask and further over an exposed portion of the surface of the MEMS device substrate according to one aspect of the present embodiments.

Referring now to FIG. 3, deposition of bumpstop material over the hardmask and further over an exposed portion of the surface of the MEMS device substrate according to one aspect of the present embodiments is shown. The bumpstop material 102 is deposited on the hardmask 101 as well as on certain areas (portions) of the surface of the substrate 110 that is exposed. In some embodiments, the bumpstop material 102 may be polysilicon, dielectric, metal, or single crystal silicon.

Figure 4:
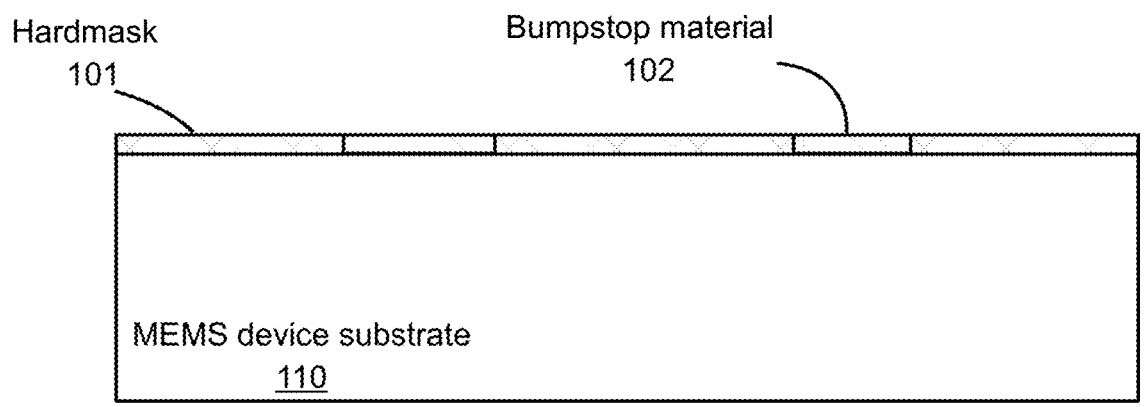
FIG. 4 shows etching back or chemical-mechanical polishing (CMP) of the bumpstop material to expose the hardmask according to one aspect of the present embodiments.

Referring now to FIG. 4, etching back or chemical-mechanical polishing (CMP) of the bumpstop material to expose the hardmask according to one aspect of the present embodiments is shown. It is appreciated that the bumpstop material 102 forms the bumpstop 103, as shown in FIG. 5.

Figure 5:
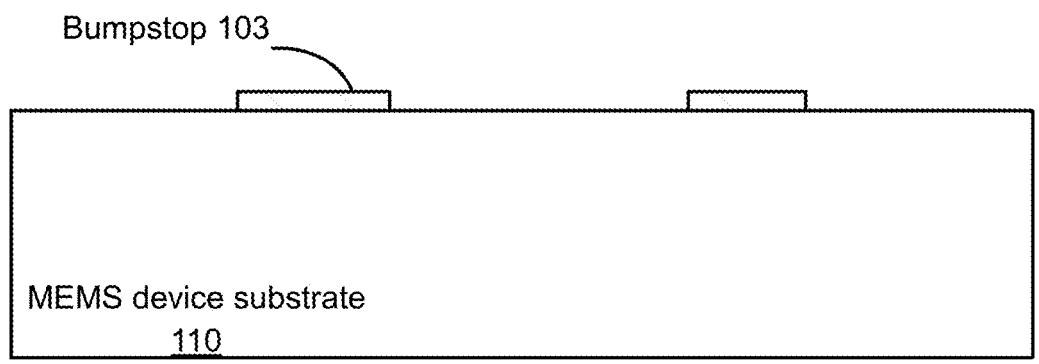
FIG. 5 shows the hardmask being removed from the surface of the MEMS device substrate according to one aspect of the present embodiments.

Referring now to FIG. 5, the hardmask being removed from the surface of the MEMS device substrate according to one aspect of the present embodiments is shown. It is appreciated that the bumpstop 103 becomes exposed once the hardmask 101 is removed. In some embodiments, the oxide mask is removed through buffered oxide etch (BOE), concentrated HF, or Vapor phase HF. In some embodiments, a portion of the surface of the MEMS device substrate 110 that is not covered by the bumpstop 103 gets exposed. In some embodiments, two bumpstops 103 are fabricated after the hardmask 101 is removed. However, it is appreciated that illustration of two bumpstops 103 is for illustrative purposes and should not be construed as limiting the scope of the embodiments.

In some embodiments, the MEMS device substrate 110 may include a MEMS accelerometer 111 or a MEMS gyroscope 112. In an illustrative embodiment, a bumpstop 103 is located within the cavity for the MEMS accelerometer 111 cavity and another bumpstop 103 is located within the cavity for the MEMS gyroscope 112.

Figure 6:
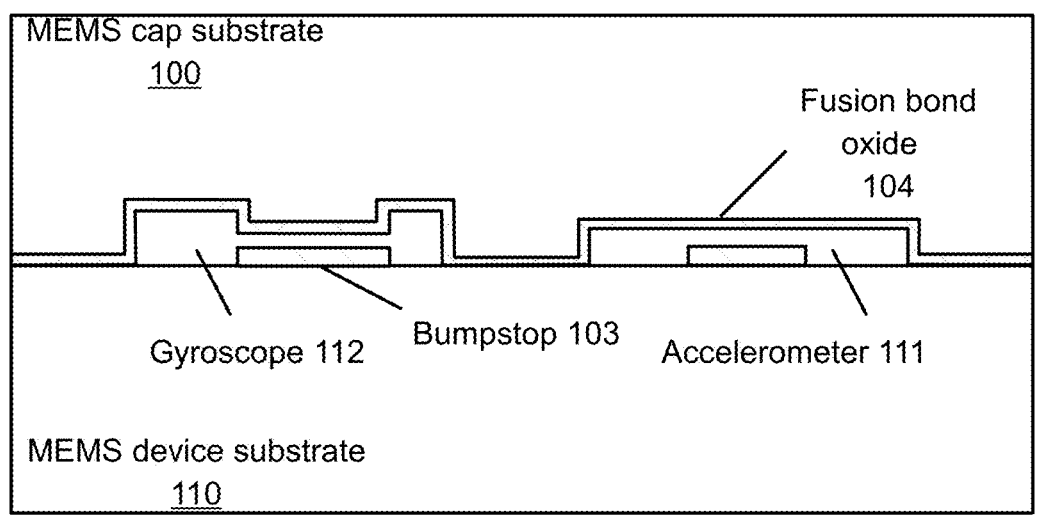
FIG. 6 shows fusion bonding a MEMS cap substrate to the MEMS device substrate according to one aspect of the present embodiments.

Referring now to FIG. 6, fusion bonding a MEMS cap substrate to the MEMS device substrate according to one aspect of the present embodiments is shown. In other words, a fusion bond oxide layer 104 of the MEMS cap substrate 100 is fusion bonded to the MEMS device substrate 110.

Figure 7:
FIG. 7 shows a substrate at an early stage of manufacture according to one aspect of the present embodiments.

Referring now to FIG. 7, a substrate at an early stage of manufacture according to one aspect of the present embodiments is shown. In some embodiment, a substrate 200 may be a silicon substrate. In one illustrative embodiment, the silicon substrate 200 is a MEMS cap substrate. A first surface 215 is a surface of the substrate 200.

Figure 8:
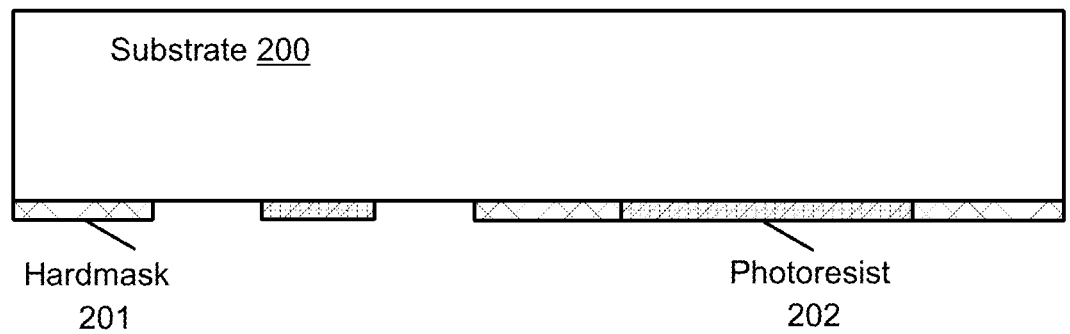
FIG. 8 shows formation of a hardmask and a photoresist layer on a first surface of the substrate according to one aspect of the present embodiments.

Referring now to FIG. 8, formation of a hardmask and a photoresist layer on a first surface of the substrate according to one aspect of the present embodiments is shown. A hardmask 201 is formed on a first surface 215 of the substrate 200. The hardmask 201 may be an oxide hardmask, a nitride hardmask, a metal hardmask, or a photoresist mask. The hardmask 201 may be patterned in some embodiments. Accordingly, certain portions of the first surface 215 of the substrate 200 is exposed while other portions of the first surface 215 is covered by the hardmask 201. In some embodiments, a photoresist layer 202 is formed on certain areas (portions) of the first surface 215 of the substrate 200 that is not covered by the hardmask 201. The photoresist layer 202 is patterned. In one illustrative embodiment, certain portions of the first surface 215 of the substrate 200 is exposed as it is not covered by either the hardmask 201 or the photoresist layer 202.

Figure 9:
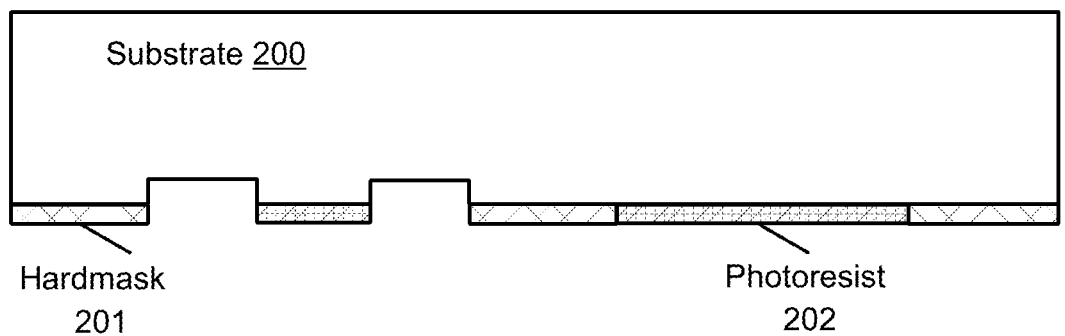
FIG. 9 shows etching of a first exposed portion of the first surface of the substrate according to one aspect of the present embodiments.

Referring now to FIG. 9, etching of a first exposed portion of the first surface of the substrate 200 according to one aspect of the present embodiments is shown. It is appreciated that the exposed portion (not covered by either the hardmask 201 or the photoresist layer 202) of the first surface 215 of the substrate 200 may be etched.

Figure 10:
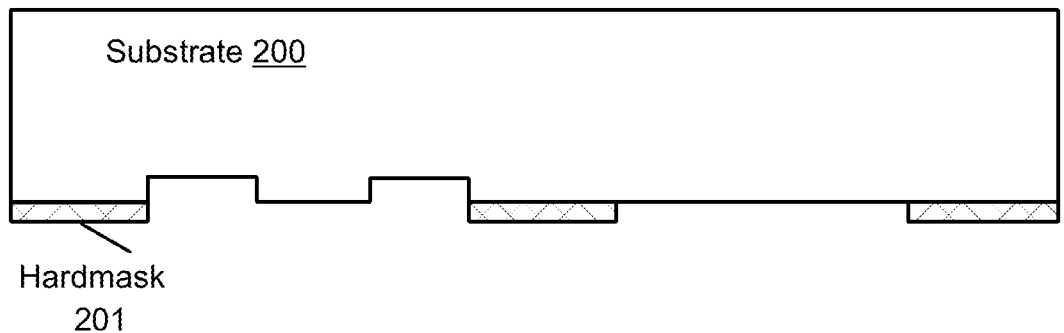
FIG. 10 shows removal of the photoresist layer from the first surface of the substrate according to one aspect of the present embodiments.

Referring now to FIG. 10, removal of the photoresist layer 202 from the first surface 215 of the substrate 200 according to one aspect of the present embodiments is shown. As such, certain portions of the first surface 215 of the substrate 200 that was previously covered by the photoresist layer 202 gets exposed.

Figure 11:
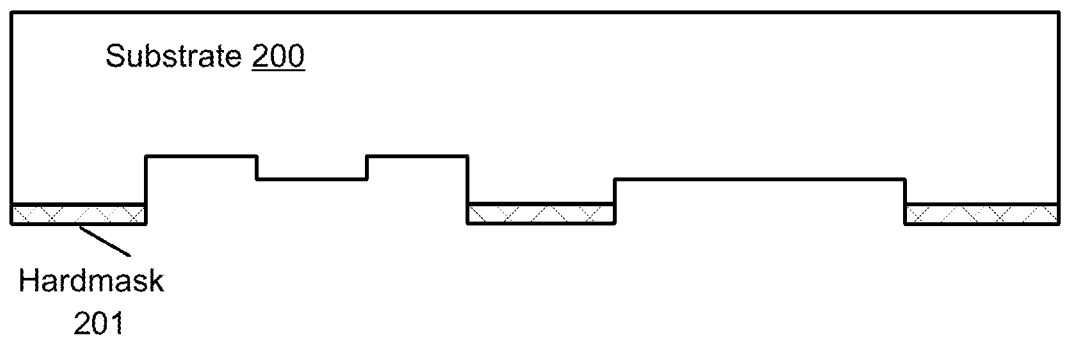
FIG. 11 shows etching of a second exposed portion of the first surface of the substrate according to one aspect of the present embodiments.

Referring now to FIG. 11, etching of a second exposed portion of the first surface of the substrate according to one aspect of the present embodiments is shown. In other words, a second exposed portion of the first surface 215 of the substrate 200 which is not covered by the hardmask 201 is etched. In one illustrative embodiment, the etched exposed portions of the first surface 215 of the substrate 200 creates two separate cavities on the first surface 215 of the substrate 200. It is appreciated that in some embodiments, one cavity may correspond to a MEMS accelerometer and the other cavity may correspond to a MEMS gyroscope.

Figure 12:
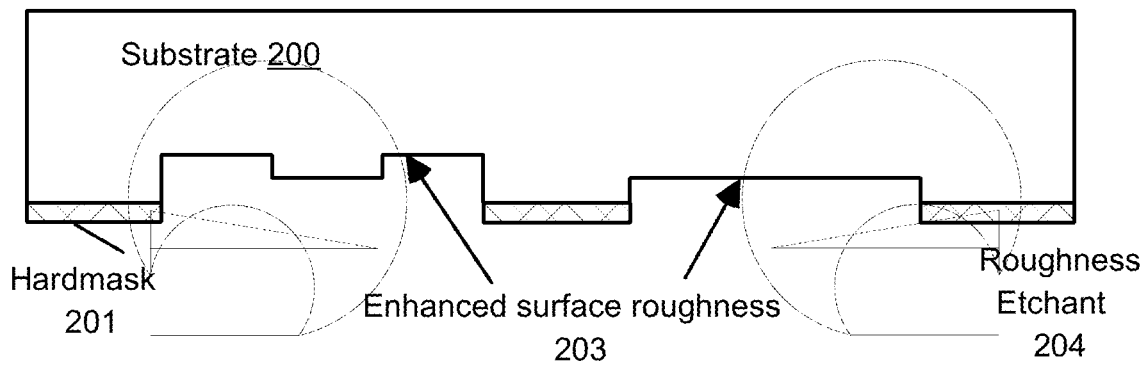
FIG. 12 shows application of roughening etchant to the first surface of the substrate to enhance surface roughness according to one aspect of the present embodiments.

Referring now to FIG. 12, application of roughening etchant to the first surface of the substrate to enhance surface roughness according to one aspect of the present embodiments is shown. In some embodiments, roughening etchant 204 is applied to enhance the surface roughness of the exposed surfaces. As such, the roughness of the exposed portion of the first surface 215 is enhanced to create the enhanced surface roughness 203. It is appreciated that any appropriate roughening etchants may be used. For example, the roughening etchant may include xenon difluoride, sulfur hexafluoride ("SF6"), and potassium hydroxide ("KOH").

Figure 13:
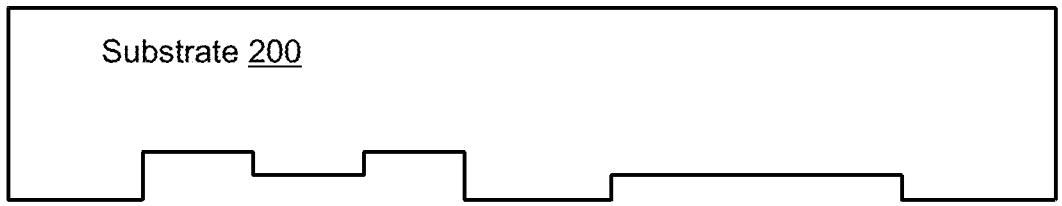
FIG. 13 shows removal of the hardmask from the first surface of the substrate according to one aspect of the present embodiments.

Referring now to FIG. 13, removal of the hardmask from the first surface of the substrate according to one aspect of the present embodiments is shown. It is appreciated that the entire first surface 215 of the substrate 200 becomes exposed after the hardmask 201 is removed.

Figure 14:
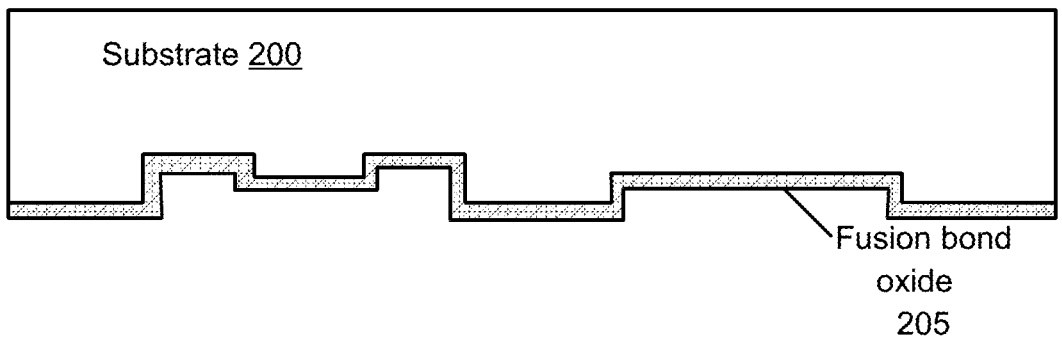
FIG. 14 shows formation of a fusion bond oxide layer on the first surface of the substrate according to one aspect of the present embodiments.

Referring now to FIG. 14, formation of a fusion bond oxide layer 205 on the first surface 215 of the substrate 200 according to one aspect of the present embodiments is shown. It is appreciated that the fusion bond layer 205 may be an oxide layer, silicon nitrite, or metal.

Figure 15:
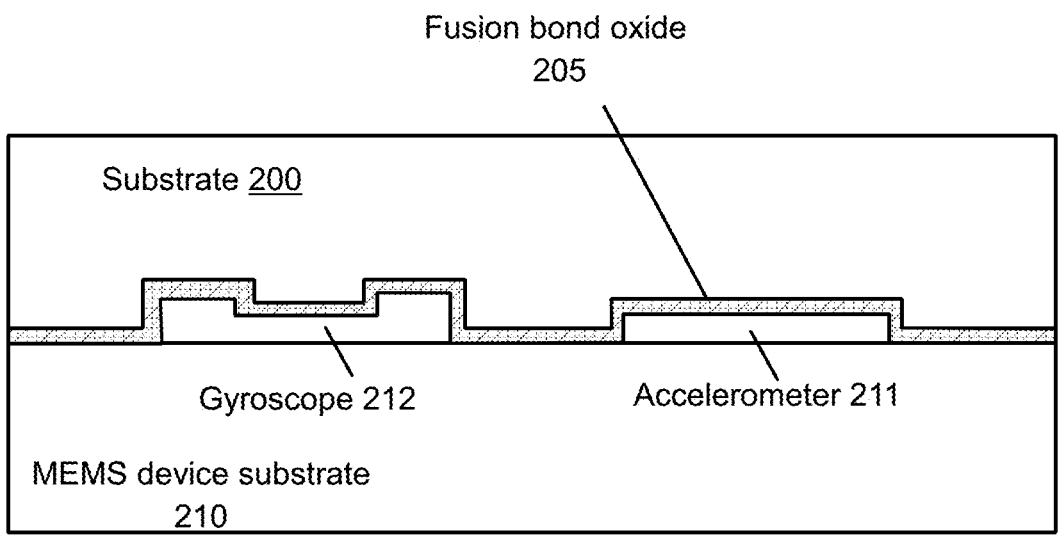
FIG. 15 shows fusion bonding the substrate to a device substrate according to one aspect of the present embodiments.

Referring now to FIG. 15, fusion bonding the substrate to a MEMS device substrate according to one aspect of the present embodiments is shown. In some embodiments, the substrate 200 may be a MEMS cap substrate that is fusion bonded to the MEMS device substrate 210. In some embodiments, the fusion bond layer 205 may be used to fusion bond the MEMS cap substrate 200 to the MEMS device substrate 210. In some embodiments, the MEMS device substrate 210 includes a MEMS accelerometer 211 or a MEMS gyroscope 212. In one illustrative embodiment, the two cavities on the first surface of the MEMS cap substrate 200 correspond to the MEMS accelerometer 211 or the MEMS gyroscope 212 of the MEMS device substrate 210 respectively.

Figure 16:
FIG. 16 shows a substrate at an early stage of manufacture according to one aspect of the present embodiments.

Referring now to FIG. 16, a substrate at an early stage of manufacture according to one aspect of the present embodiments is shown. In some embodiment, a substrate 300 may be a silicon substrate. In one illustrative embodiment, the silicon substrate 300 is a MEMS cap substrate. A first surface 315 is a surface of the substrate 300.

Figure 17:
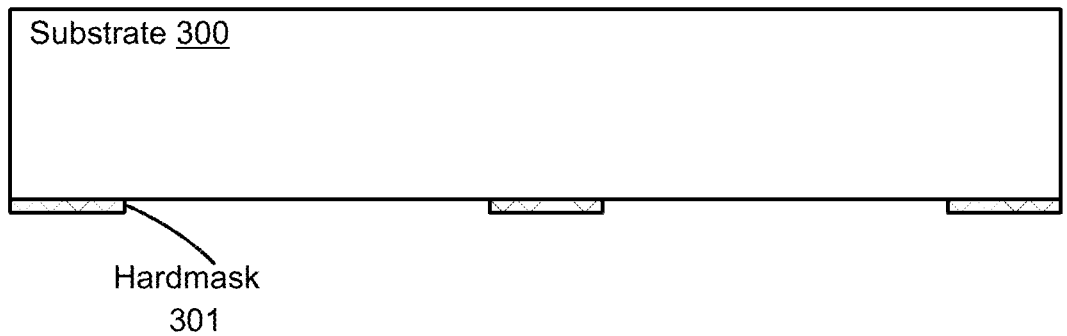
FIG. 17 shows formation of a hardmask on a first surface of the substrate according to one aspect of the present embodiments.

Referring now to FIG. 17, formation of a hardmask on a first surface of the substrate according to one aspect of the present embodiments is shown. A hardmask 301 is formed on a first surface 315 of the substrate 300. The hardmask 301 may be an oxide hardmask, a nitride hardmask, a metal hardmask, or a photoresist mask. In this illustrative embodiment, the hardmask 301 is an oxide hardmask. The hardmask 301 is patterned. Accordingly, certain portions of the first surface 315 of the substrate 300 is exposed while other portions of the first surface is covered by the hardmask 301.

Figure 18:
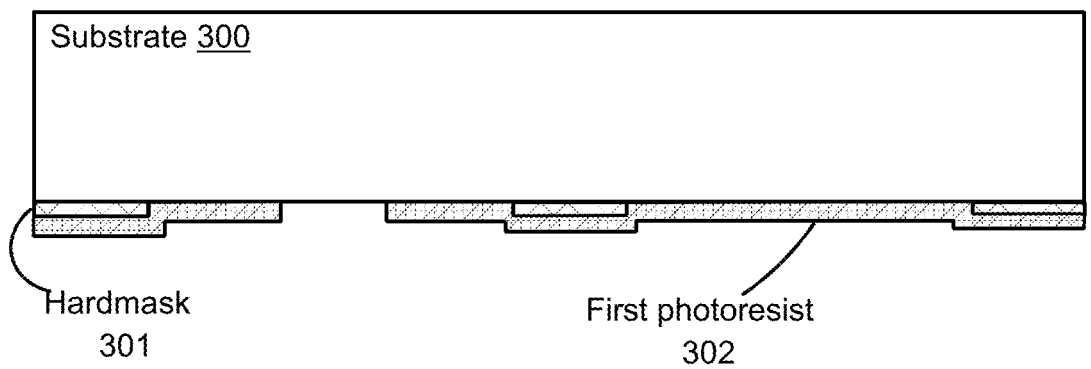
FIG. 18 shows formation of a first photoresist layer on the hardmask and on some portions of the first surface of the substrate according to one aspect of the present embodiments.

Referring now to FIG. 18, formation of a first photoresist layer on the hardmask and on some portions of the first surface of the substrate according to one aspect of the present embodiments is shown. In some embodiments, a first photoresist layer 302 is formed on the hardmask 301 and certain areas (portions) of the first surface 315 of the substrate 300 that is not covered by the hardmask 301. The first photoresist layer 302 is patterned. In one illustrative embodiment, certain portions of the first surface 315 of the substrate 300 is exposed as it is not covered by either the hardmask 301 or the first photoresist layer 302.

Figure 19:
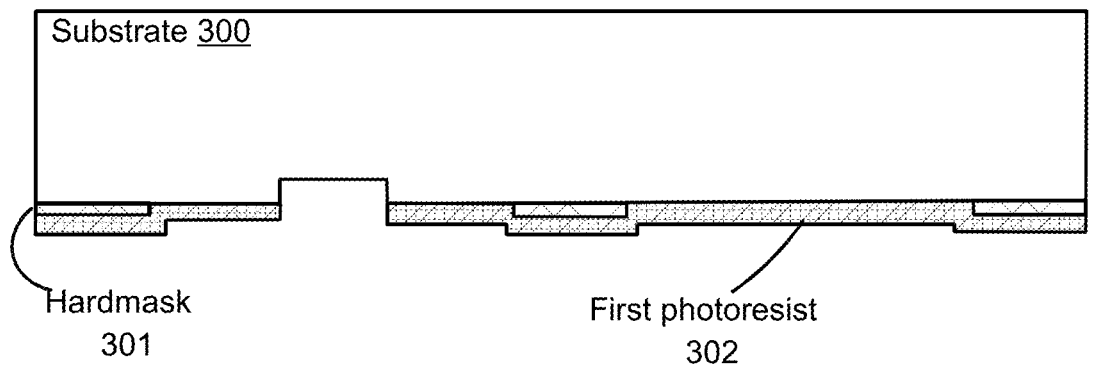
FIG. 19 shows etching of a first exposed portion of the first surface of the substrate according to one aspect of the present embodiments.

Referring now to FIG. 19, etching of a first exposed portion of the first surface of the substrate according to one aspect of the present embodiments is shown. It is appreciated that the exposed portion (not covered by either the hardmask 301 or the first photoresist layer 302) of the first surface 315 of the substrate 300 is etched.

Figure 20:
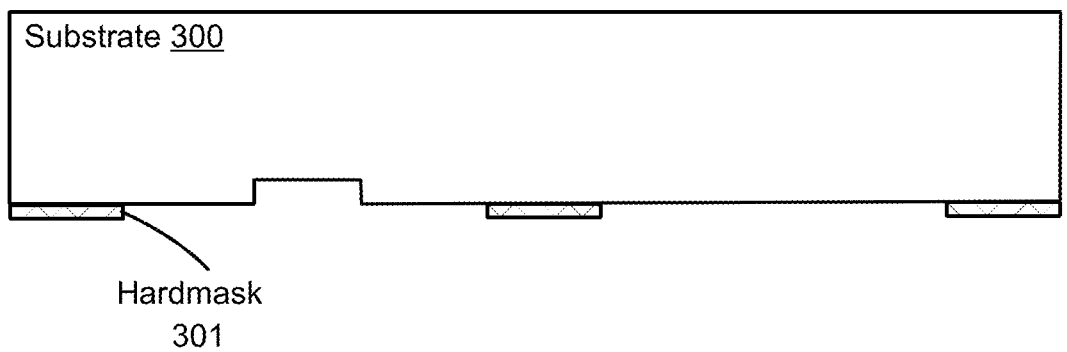
FIG. 20 shows removal of the first photoresist layer from the first surface of the substrate according to one aspect of the present embodiments.

Referring now to FIG. 20, removal of the first photoresist layer 302 from the first surface 315 of the substrate 300 according to one aspect of the present embodiments is shown. As such, certain portions of the first surface 315 of the substrate 300 that was covered by the first photoresist layer 302 is exposed.

Figure 21:
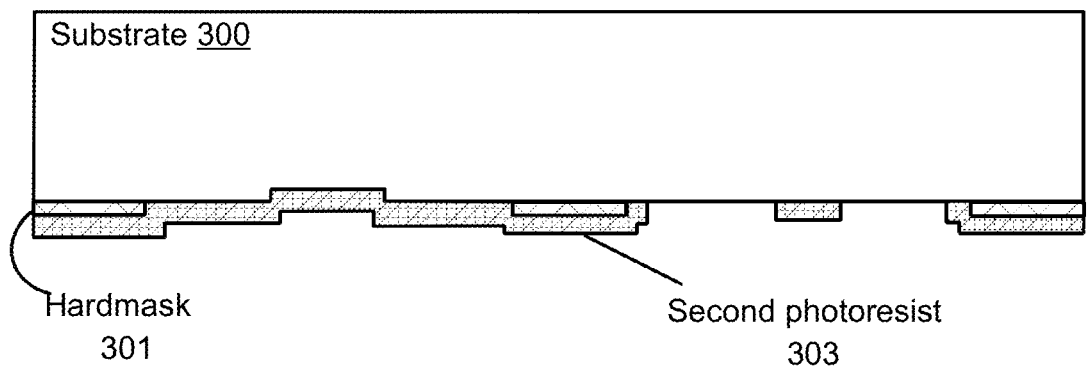
FIG. 21 shows formation of a second photoresist layer on the hardmask and on some portions of the first surface of the substrate according to one aspect of the present embodiments.

Referring now to FIG. 21, formation of a second photoresist layer on the hardmask and on some portions of the first surface of the substrate according to one aspect of the present embodiments is shown. In some embodiments, a second photoresist layer 303 is formed on the hardmask 301 and certain areas (portions) of the first surface 315 of the substrate 300 that is not covered by the hardmask 301. The second photoresist layer 303 is patterned. In one illustrative embodiment, certain portions of the first surface 315 of the substrate 300 is exposed as it is not covered by either the hardmask 301 or the second photoresist layer 303.

Figure 22:
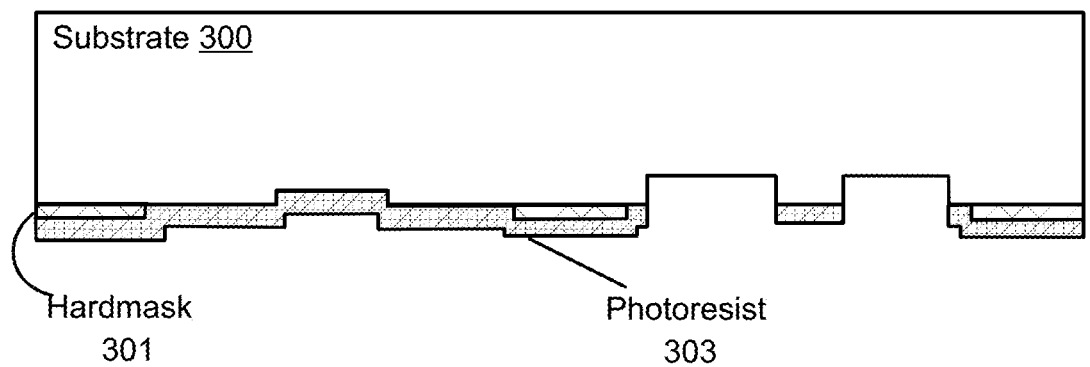
FIG. 22 shows etching of a second exposed portion of the first surface of the substrate according to one aspect of the present embodiments.

Referring now to FIG. 22, etching of a second exposed portion of the first surface of the substrate according to one aspect of the present embodiments is shown. In other words, a second exposed portion (not covered by either the hardmask 301 or the second photoresist layer 303) of the first surface 315 of the silicon substrate 300 is etched.

Figure 23:
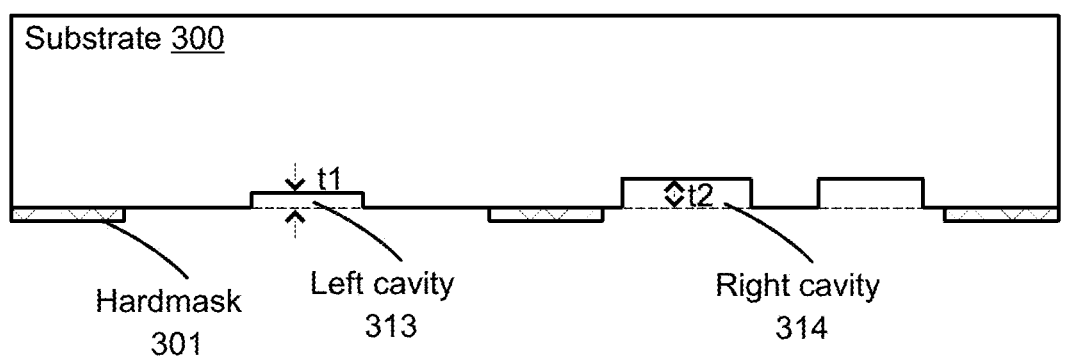
FIG. 23 shows removal of the second photoresist layer from the first surface of the substrate according to one aspect of the present embodiments.

Referring now to FIG. 23, removal of the second photoresist layer from the first surface of the substrate according to one aspect of the present embodiments is shown. As such, certain portions of the first surface 315 of the substrate 300 that was covered by the second photoresist layer 303 is exposed. In one illustrative embodiment, after the second etch shown in FIG. 22, the etched exposed portions of the first surface 315 of the substrate 300 creates a left cavity 313 and a right cavity 314 on the first surface 315 of the substrate 300. In one illustrative embodiment, the depth of the left cavity 313 is t1 (i.e., the depth of the first etch); and the depth of the right cavity 314 is t2 (i.e., the depth of the second etch).

Figure 24:
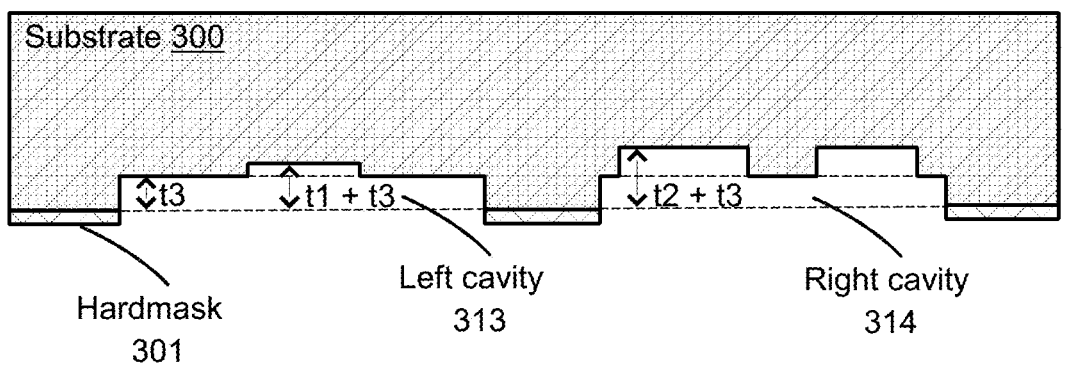
FIG. 24 shows etching of a third exposed portion of the first surface of the substrate according to one aspect of the present embodiments.

Referring now to FIG. 24, etching of a third exposed portion of the first surface of the substrate according to one aspect of the present embodiments is shown. In other words, a third exposed portion of the first surface 315 of the substrate 300 which is not covered by the hardmask 301 is etched. In one illustrative embodiment, after the third etch shown in FIG. 24, the depth of the left cavity 313 and a right cavity 314 will be incremented by the depth of the third etch (t3). Accordingly, after the third etch, the depth of the left cavity 313 is t1+t3; and the depth of the right cavity 314 is t2+t3.

In some embodiments, the left cavity 313 is used as an accelerometer cavity when fusion bonded with a MEMS device substrate 310 (shown in FIGS. 29-34 below). In some embodiments, the right cavity 314 is used as a gyroscope cavity when fusion bonded with a MEMS device substrate 310 (shown in FIGS. 29-34 below). In some embodiments, it is desirable to reduce the contact area between the proof mass and the cavity surface with minimal impact on the cavity volume, e.g., increasing the pressure of the accelerometer cavity (e.g., decreasing the volume of the accelerometer cavity) while reducing (or at least maintaining) the pressure of the gyroscope cavity (e.g., the volume of the gyroscope cavity is increased or at least not decreased). After three etching steps with etching depths of t1, t2, and t3 respectively, the depth of the left cavity 313 (accelerometer cavity) becomes t1+t3 and the depth of the right cavity 314 (gyroscope cavity) becomes t2+t3. With the combination of t1, t2 and t3, the low volume of the accelerometer cavity is achieved while a higher volume of the gyroscope cavity is achieved.

Figure 25:
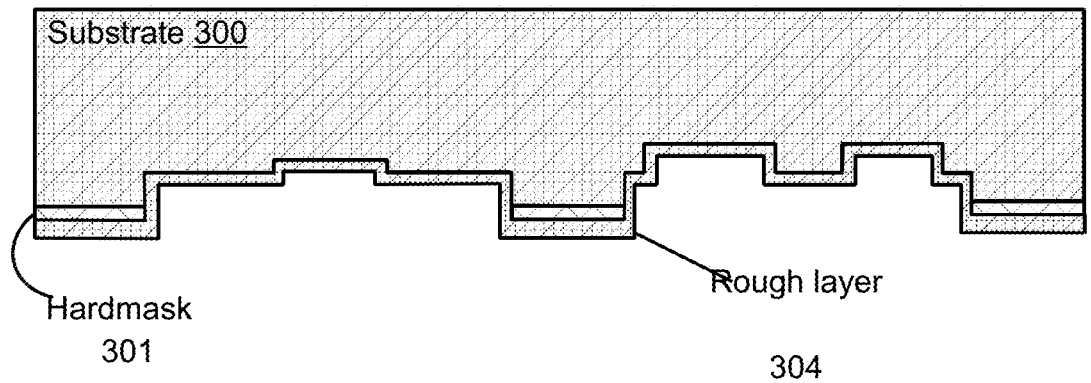
FIG. 25 shows formation of a rough surface layer on the hardmask and on the first surface of the substrate according to one aspect of the present embodiments.

Referring now to FIG. 25, formation of a rough surface layer on the hardmask and on the first surface of the substrate according to one aspect of the present embodiments is shown. In some embodiments, a rough surface layer 304 is formed on the hardmask 301 and the first surface 315 of the substrate 300 that is not covered by the hardmask 301. In some embodiments, the rough surface layer 304 includes polysilicon.

Figure 26:
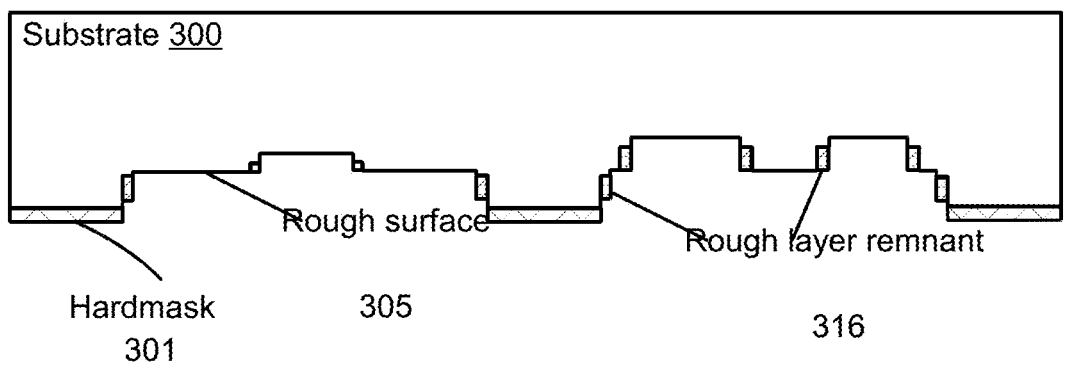
FIG. 26 shows etching back of the rough surface layer according to one aspect of the present embodiments.

Referring now to FIG. 26, etching back of the rough surface layer according to one aspect of the present embodiments is shown. It is appreciated that after the rough surface layer 304 is etched back, the roughness is transferred to the exposed portion of the first surface of the substrate 300. Accordingly, the exposed surface becomes a rough surface 305. In an illustrative embodiment, the etching back is more than a sum of a thickness of the rough surface layer and a thickness of the hardmask. In some embodiments, after the etch back, there are still some rough layer remnant 316 left on the first surface of the substrate 300.

Figure 27:
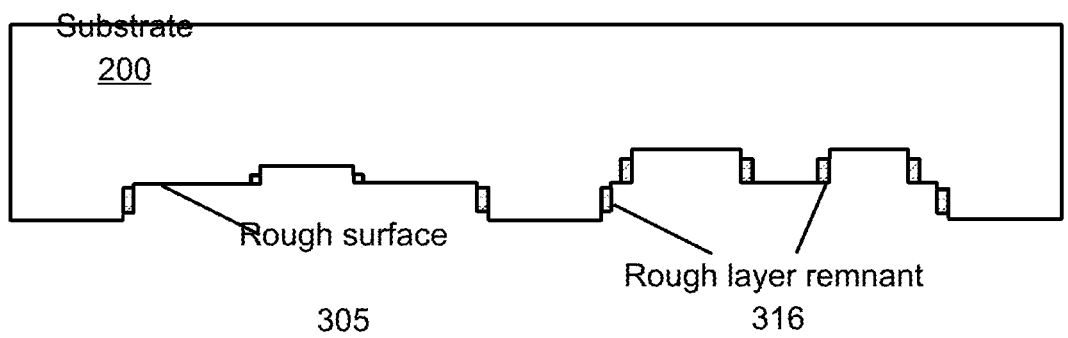
FIG. 27 shows removal of the hardmask from the first surface of the substrate according to one aspect of the present embodiments.

Referring now to FIG. 27, removal of the hardmask from the first surface of the substrate according to one aspect of the present embodiments is shown. As such, the whole first surface 315 of the substrate 300 is exposed after the hardmask 301 is removed. In some embodiments, the steps of applying and etching back the rough surface layer 304 (shown in FIGS. 25-26 above) are performed before the hardmask 301 is removed. In some other embodiments, the removal of the hardmask 301 occurs after the third etch (shown in FIG. 24 above) without performing the steps in FIGS. 25-26. In some further embodiments, before removing the hardmask 301, a step of applying roughening etchant (such as those shown in FIG. 12) to the third exposed portion of the first surface 315 of the substrate 300 may be performed.

Figure 28:
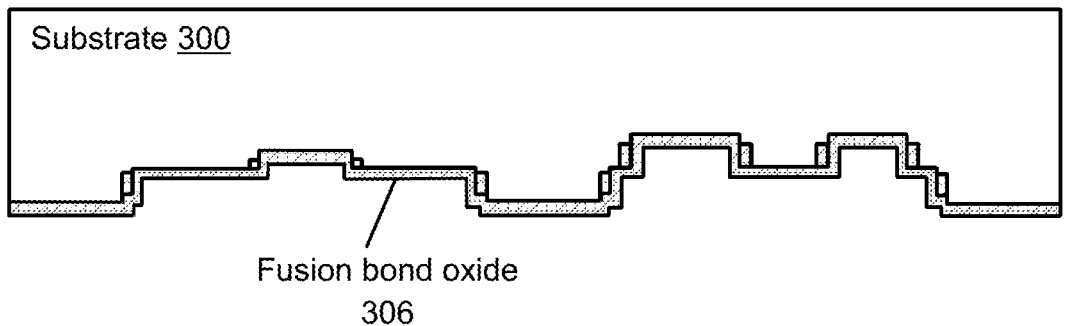
FIG. 28 shows formation of a fusion bond oxide layer on the first surface of the substrate according to one aspect of the present embodiments.

Referring now to FIG. 28, formation of a fusion bond oxide layer 306 on the first surface 315 of the substrate 300 according to one aspect of the present embodiments is shown. It is appreciated that the fusion bond oxide 306 may be an oxide layer.

Figure 29:
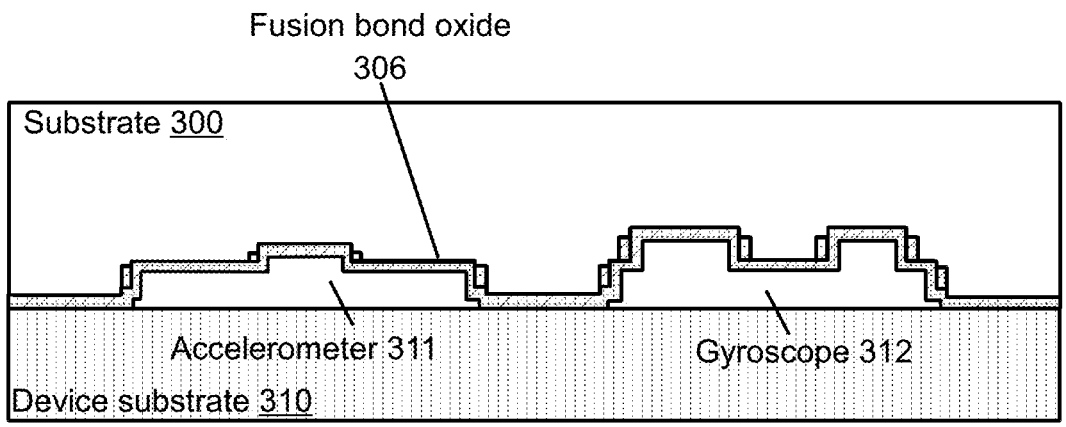
FIG. 29 shows fusion bonding the substrate to a device substrate according to one aspect of the present embodiments.

Referring now to FIG. 29, fusion bonding the substrate to a MEMS device substrate according to one aspect of the present embodiments is shown. In some embodiments, the substrate 300 is a MEMS cap substrate. In other words, the fusion bond oxide 306 of the MEMS cap substrate 300 is fusion bonded to a MEMS device substrate 310. In some embodiments, the MEMS device substrate 310 includes a MEMS accelerometer 311 or a MEMS gyroscope 312. In one illustrative embodiment, the left cavity 313 and the right cavity 314 on the first surface of the MEMS cap substrate 300 correspond to the MEMS accelerometer 311 or the MEMS gyroscope 312 of the MEMS device substrate 310 respectively.

Figure 30:
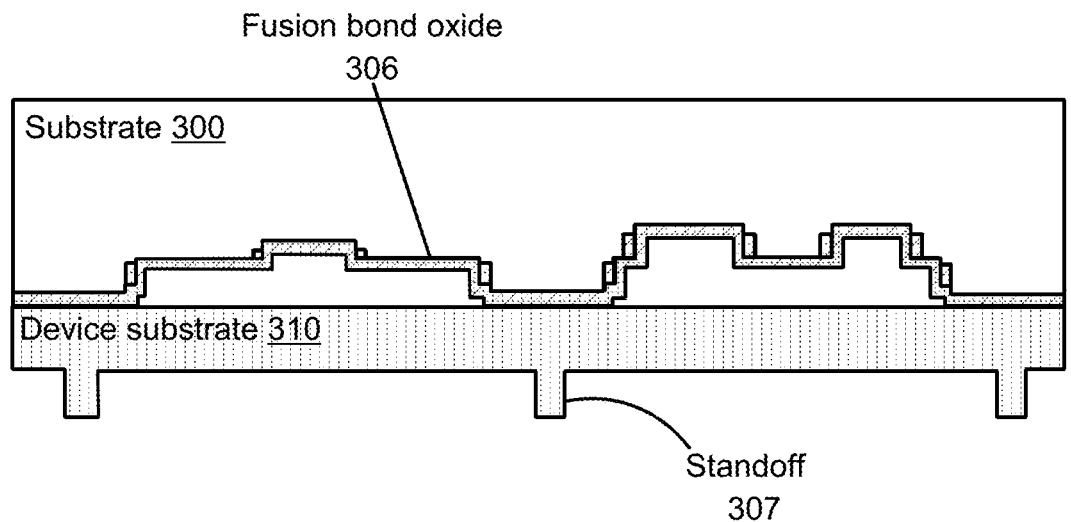
FIG. 30 shows formation of a standoff on a surface of the device substrate opposite to a surface of the fusion bond according to one aspect of the present embodiments.

Referring now to FIG. 30, formation of a standoff on a surface of the device substrate opposite to a surface of the fusion bond according to one aspect of the present embodiments is shown. In some embodiments, standoff 307 is formed on a surface of the device substrate 310 opposite to a surface of the fusion bond. It is appreciated that standoff 307 may be a vertical structure providing electrical contact.

Figure 31:
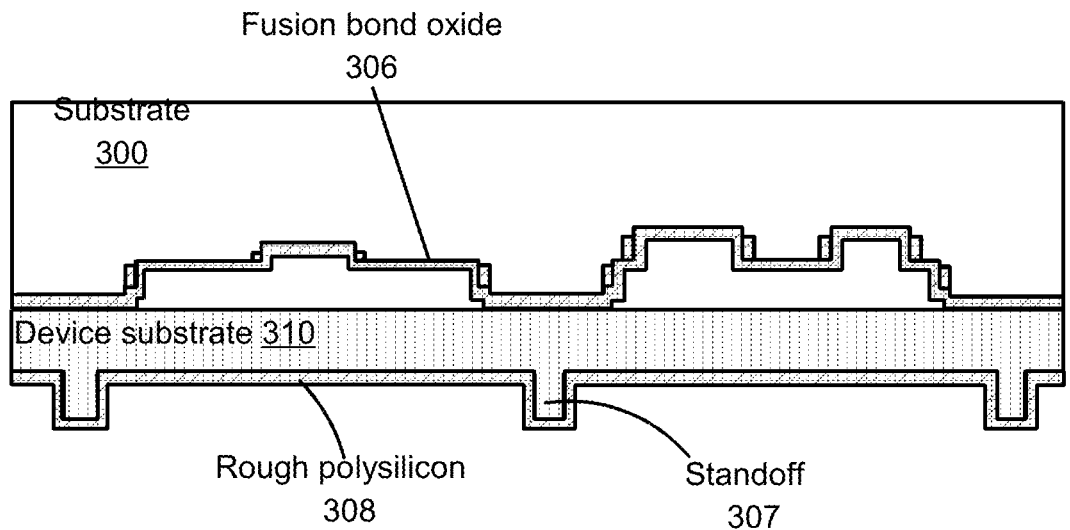
FIG. 31 shows formation of a rough polysilicon layer on a surface of the device substrate that is opposite to the surface of the fusion bond and on the standoff according to one aspect of the present embodiments.

Referring now to FIG. 31, formation of a rough polysilicon layer on a surface of the device substrate that is opposite to the surface of the fusion bond and on the standoff according to one aspect of the present embodiments is shown. As such, a rough polysilicon layer 308 is formed on a surface of the device substrate 310 that is opposite to the surface of the fusion bond 306 and on the standoff 307.

Figure 32:
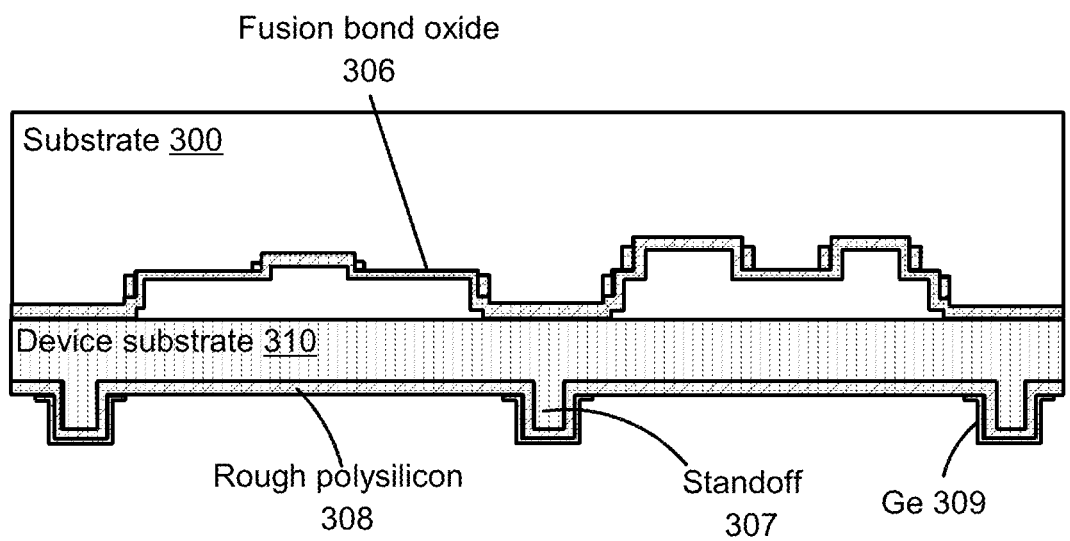
FIG. 32 shows formation of a germanium (Ge) layer on the rough polysilicon layer according to one aspect of the present embodiments.

Referring now to FIG. 32, formation of a germanium (Ge) layer on the rough polysilicon layer according to one aspect of the present embodiments is shown. A germanium (Ge) film 309 is deposited onto the device substrate 310 followed by patterning the germanium to define a standoff 307.

Figure 33:
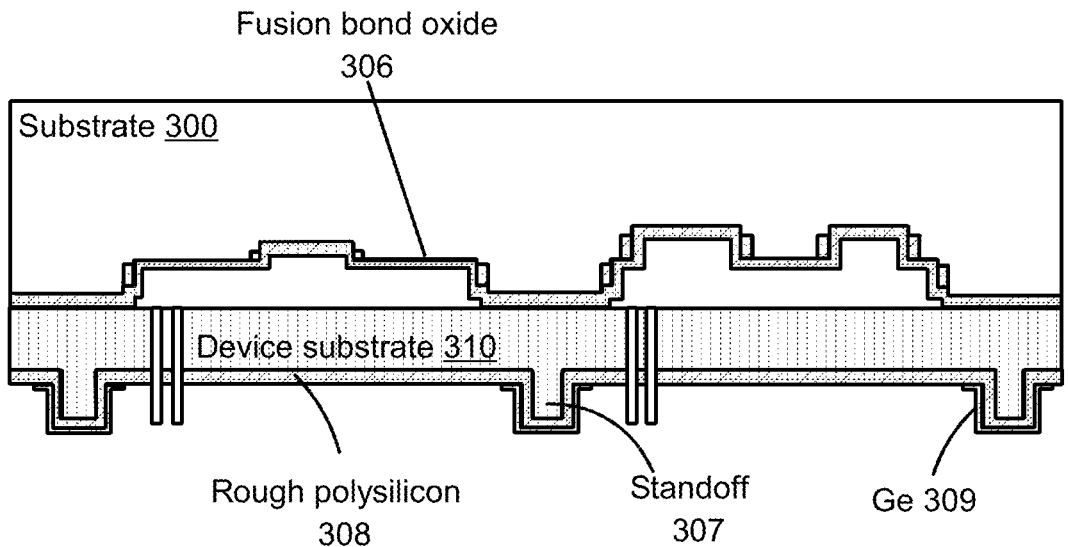
FIG. 33 shows formation of an ACT layer patterning on the device substrate according to one aspect of the present embodiments.

Referring now to FIG. 33, formation of an ACT layer patterning on the device substrate according to one aspect of the present embodiments is shown.

Figure 34:
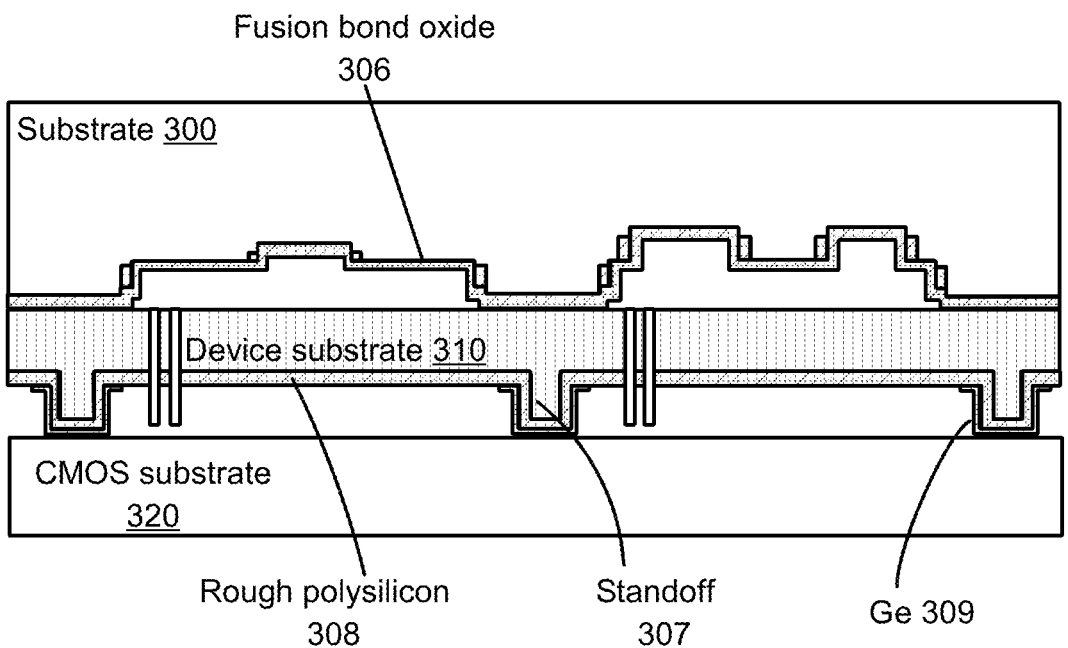
FIG. 34 shows eutectic bonding a MEMS substrate to a complementary metal-oxide (CMOS) layer according to one aspect of the present embodiments.

Referring now to FIG. 34, eutectic bonding a MEMS substrate to a CMOS substrate according to one aspect of the present embodiments is shown. In some embodiments, the MEMS cap substrate 300 and the MEMS device substrate 310 are collectively referred to as MEMS substrate. In some embodiments, the MEMS substrate is eutectic bonded to a CMOS substrate 320.

Figure 35:
FIG. 35 shows a substrate at an early stage of manufacture according to one aspect of the present embodiments.

Referring now to FIG. 35, a substrate at an early stage of manufacture according to one aspect of the present embodiments is shown. In some embodiment, a substrate 400 may be a silicon substrate. In one illustrative embodiment, the silicon substrate 400 is a MEMS cap substrate.

Figure 36:
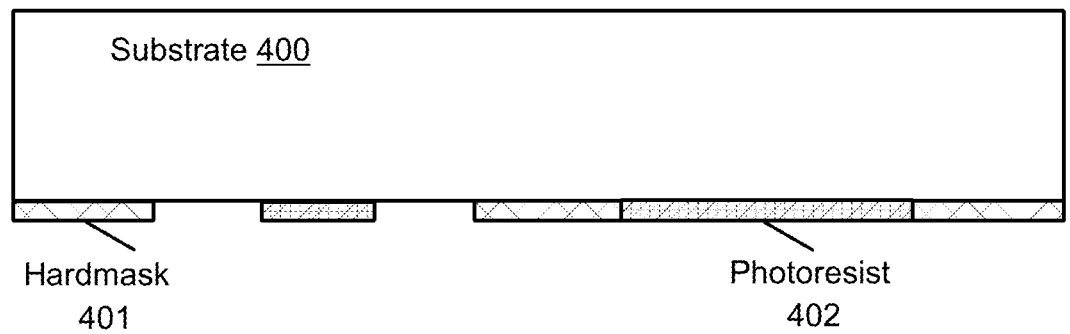
FIG. 36 shows formation of a hardmask and a photoresist layer on a first surface of the substrate according to one aspect of the present embodiments.

Referring now to FIG. 36, formation of a hardmask and a photoresist layer on a first surface of the substrate according to one aspect of the present embodiments is shown. A hardmask 401 is formed on a first surface of the substrate 400. The hardmask 401 may be an oxide hardmask, a nitride hardmask, a metal hardmask, or a photoresist mask. In this illustrative embodiment, the hardmask 401 is an oxide hardmask. The hardmask 401 is patterned. Accordingly, certain portions of the first surface of the substrate 400 is exposed while other portions of the first surface is covered by the hardmask 401. In some embodiments, a photoresist layer 402 is formed on certain areas (portions) of the first surface of the substrate 400 that is not covered by the hardmask 401. The photoresist layer 402 is patterned. In one illustrative embodiment, certain portions of the first surface of the substrate 400 is exposed as it is not covered by either the hardmask 401 or the photoresist layer 402.

Figure 37:
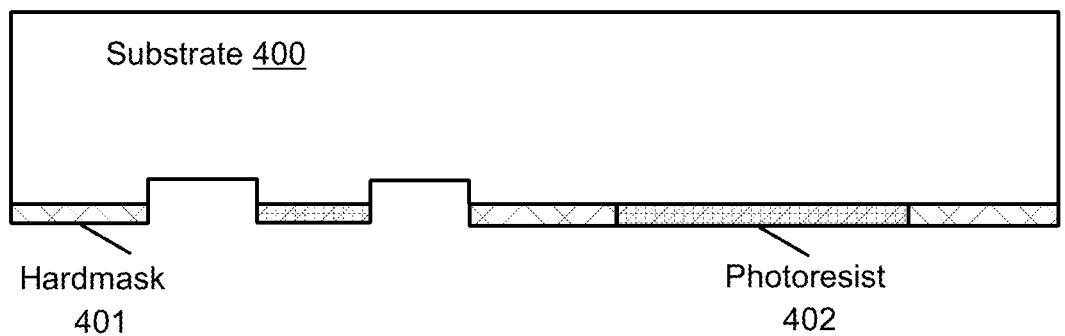
FIG. 37 shows etching of a first exposed portion of the first surface of the substrate according to one aspect of the present embodiments.

Referring now to FIG. 37, etching of a first exposed portion of the first surface of the substrate according to one aspect of the present embodiments is shown. It is appreciated that the exposed portion (not covered by either the hardmask 401 or the photoresist layer 402) of the substrate 400 is etched.

Figure 38:
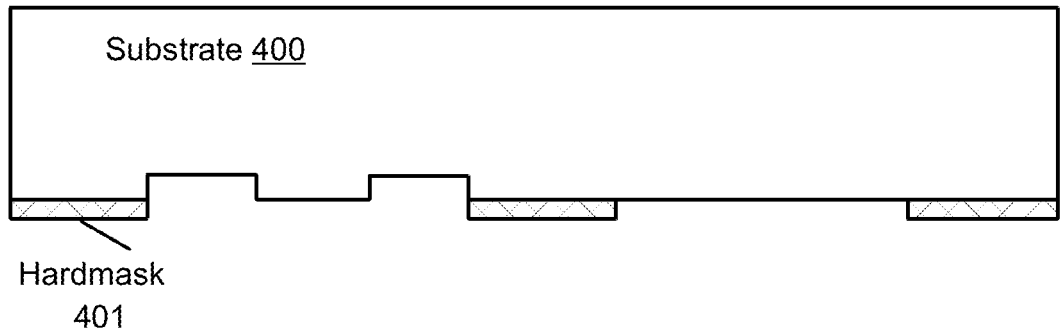
FIG. 38 shows removal of the photoresist layer from the first surface of the substrate according to one aspect of the present embodiments.

Referring now to FIG. 38, removal of the photoresist layer from the first surface of the substrate according to one aspect of the present embodiments is shown. As such, certain portions of the first surface of the substrate 400 that was covered by the photoresist layer 402 is exposed.

Figure 39:
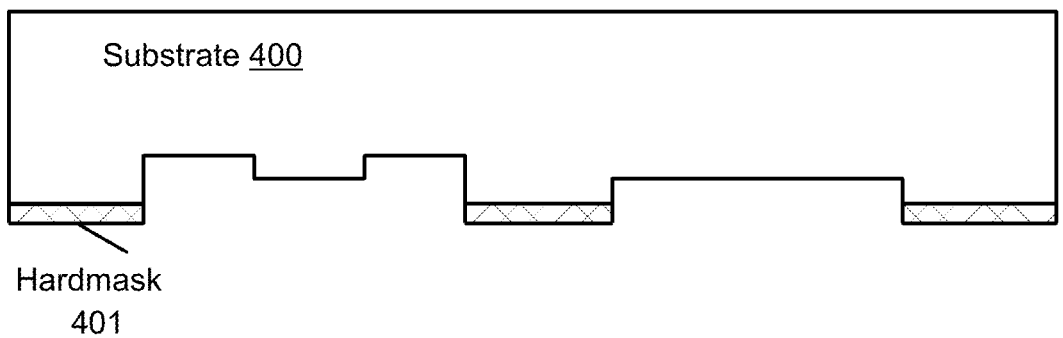
FIG. 39 shows etching of a second exposed portion of the first surface of the substrate according to one aspect of the present embodiments.

Referring now to FIG. 39, etching of a second exposed portion of the first surface of the substrate according to one aspect of the present embodiments is shown. In other words, a second exposed portion of the first surface of the substrate 400 which is not covered by the hardmask 401 is etched. In one illustrative embodiment, the etched exposed portions of the first surface of the substrate 400 produces two separate cavities on the first surface of the substrate.

Figure 40:
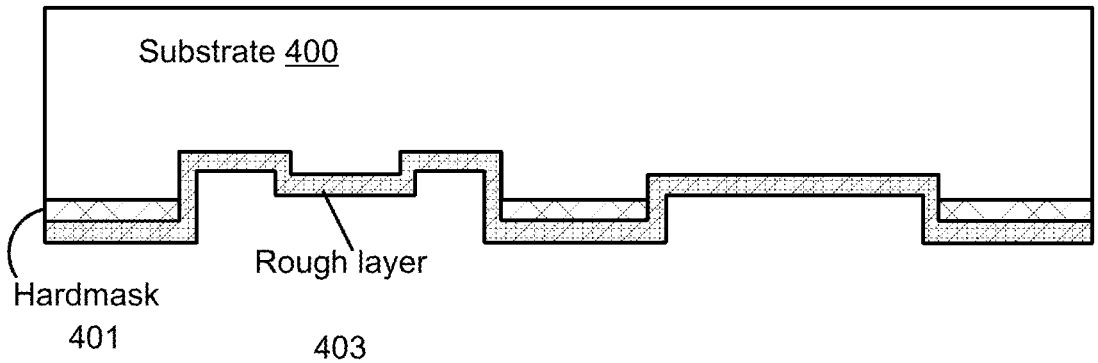
FIG. 40 shows formation of a rough surface layer on the hardmask and on the first surface of the substrate according to one aspect of the present embodiments.

Referring now to FIG. 40, formation of a rough surface layer on the hardmask and on the first surface of the substrate according to one aspect of the present embodiments is shown. In some embodiments, a rough surface layer 403 is formed on the hardmask 401 and the first surface of the substrate 400 that is not covered by the hardmask 401. In some embodiments, the rough surface layer 403 includes polysilicon.

Figure 41:
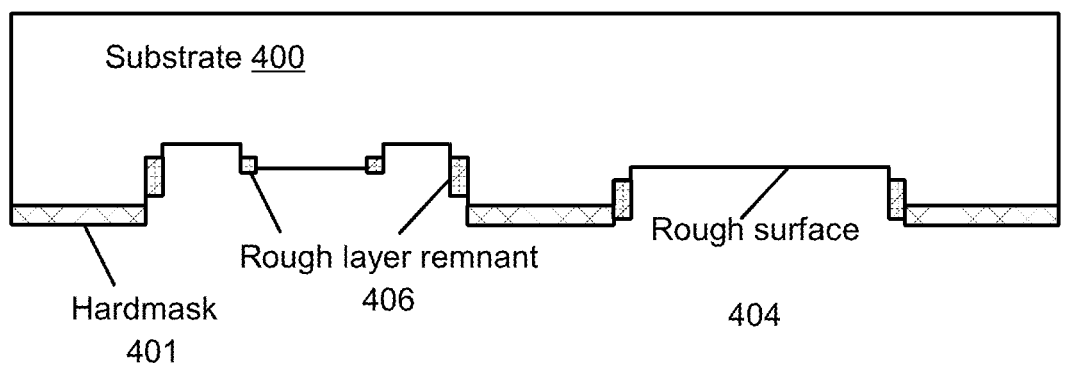
FIG. 41 shows etching back of the rough surface layer according to one aspect of the present embodiments.

Referring now to FIG. 41, etching back of the rough surface layer according to one aspect of the present embodiments is shown. It is appreciated that after the rough surface layer 403 is etched back, the roughness is transferred to the exposed portion of the first surface of the substrate 400. Accordingly, the exposed surface becomes a rough surface 404. In an illustrative embodiment, the etching back is more than a sum of a thickness of the rough surface layer and a thickness of the hardmask. In some embodiments, after the etch back, there are still some rough layer remnant 406 left on the first surface of the substrate 400.

Figure 42:
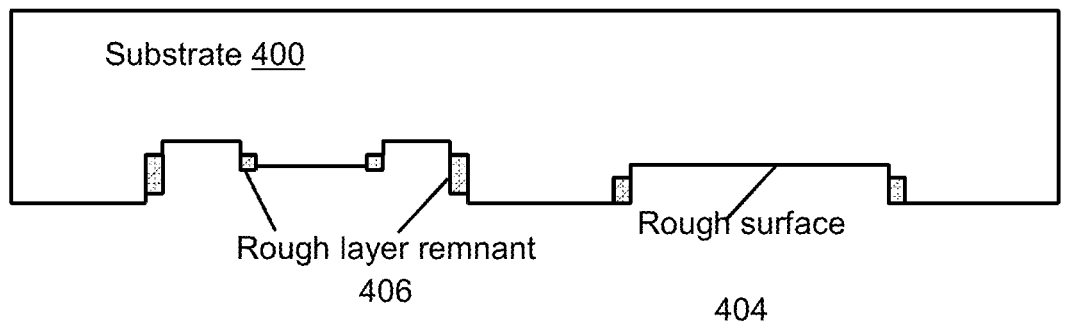
FIG. 42 shows removal of the hardmask from the first surface of the substrate according to one aspect of the present embodiments.

Referring now to FIG. 42, removal of the hardmask from the first surface of the substrate according to one aspect of the present embodiments is shown. As such, the whole first surface of the substrate 400 is exposed after the hardmask 401 is removed.

Figure 43:
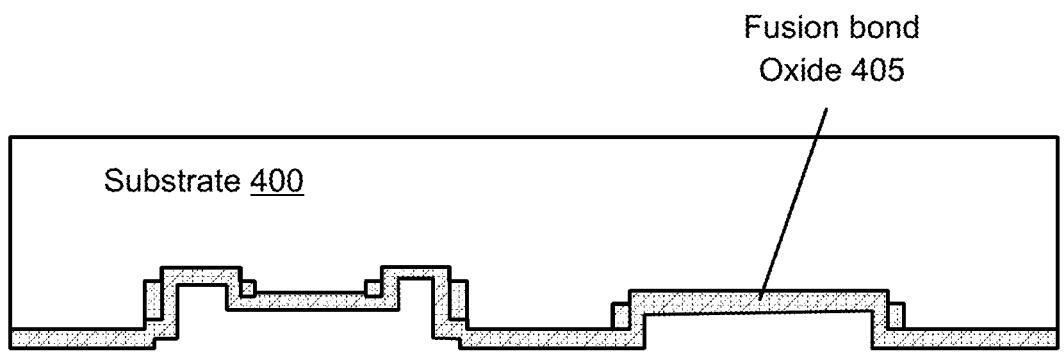
FIG. 43 shows formation of a fusion bond oxide layer on the first surface of the substrate according to one aspect of the present embodiments.

Referring now to FIG. 43, formation of a fusion bond oxide layer on the first surface of the substrate according to one aspect of the present embodiments is shown. It is appreciated that the fusion bond oxide 405 may be an oxide layer.

Figure 44:
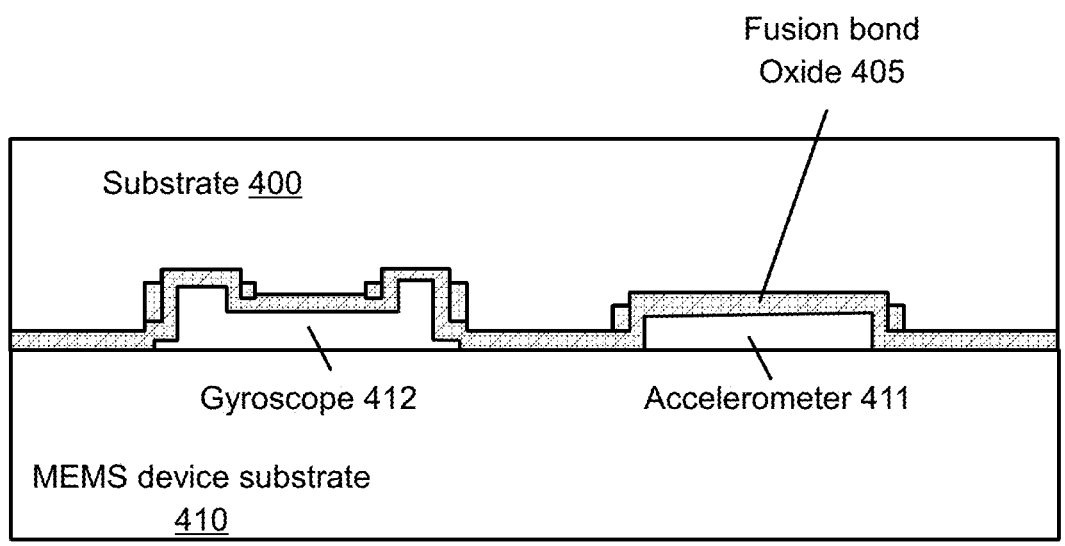
FIG. 44 shows eutectic bonding a MEMS device substrate to a CMOS substrate according to one aspect of the present embodiments.

Referring now to FIG. 44, fusion bonding of the substrate to a MEMS device substrate according to one aspect of the present embodiments is shown. In some embodiments, the substrate 400 is a MEMS cap substrate. In other words, the fusion bond oxide 405 of the MEMS cap substrate 400 is fusion bonded to a MEMS device substrate 410. In some embodiments, the MEMS device substrate 410 includes a MEMS accelerometer 411 or a MEMS gyroscope 412. In one illustrative embodiment, the two cavities on the first surface 415 of the MEMS cap substrate 400 correspond to the MEMS accelerometer 411 or the MEMS gyroscope 412 of the MEMS device substrate 410 respectively.

Figure 45:
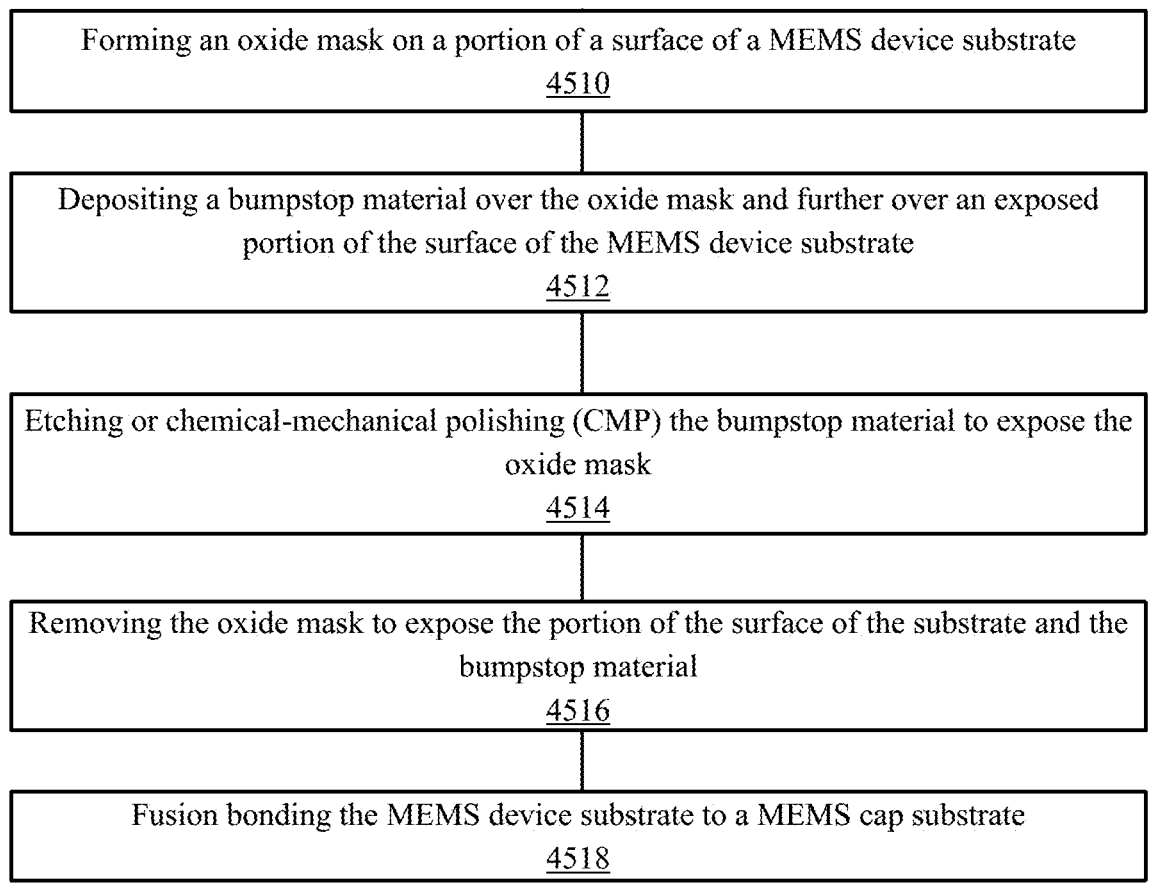
FIG. 45 shows a method of reducing stiction by fabricating bumpstops on a surface of a MEMS device substrate according to one aspect of the present embodiments.

Referring now to FIG. 45, a method of reducing stiction by fabricating bumpstops on a surface of a MEMS device substrate according to one aspect of the present embodiments is shown. The method steps described here have been described in FIGS. 1-6. At step 4510, an oxide mask is formed on a portion of a surface of a MEMS device substrate. At step 4512, a bumpstop material is deposited over the oxide mask and further over an exposed portion of the surface of the MEMS device substrate. At step 4514, the bumpstop material is etched back or chemical-mechanical polished (CMP) to expose the oxide mask. At step 4516, the oxide mask is removed to expose the portion of the surface of the substrate and the bumpstop material. At step 4518, the MEMS device substrate is fusion bonded to a MEMS cap substrate.

Figure 46:
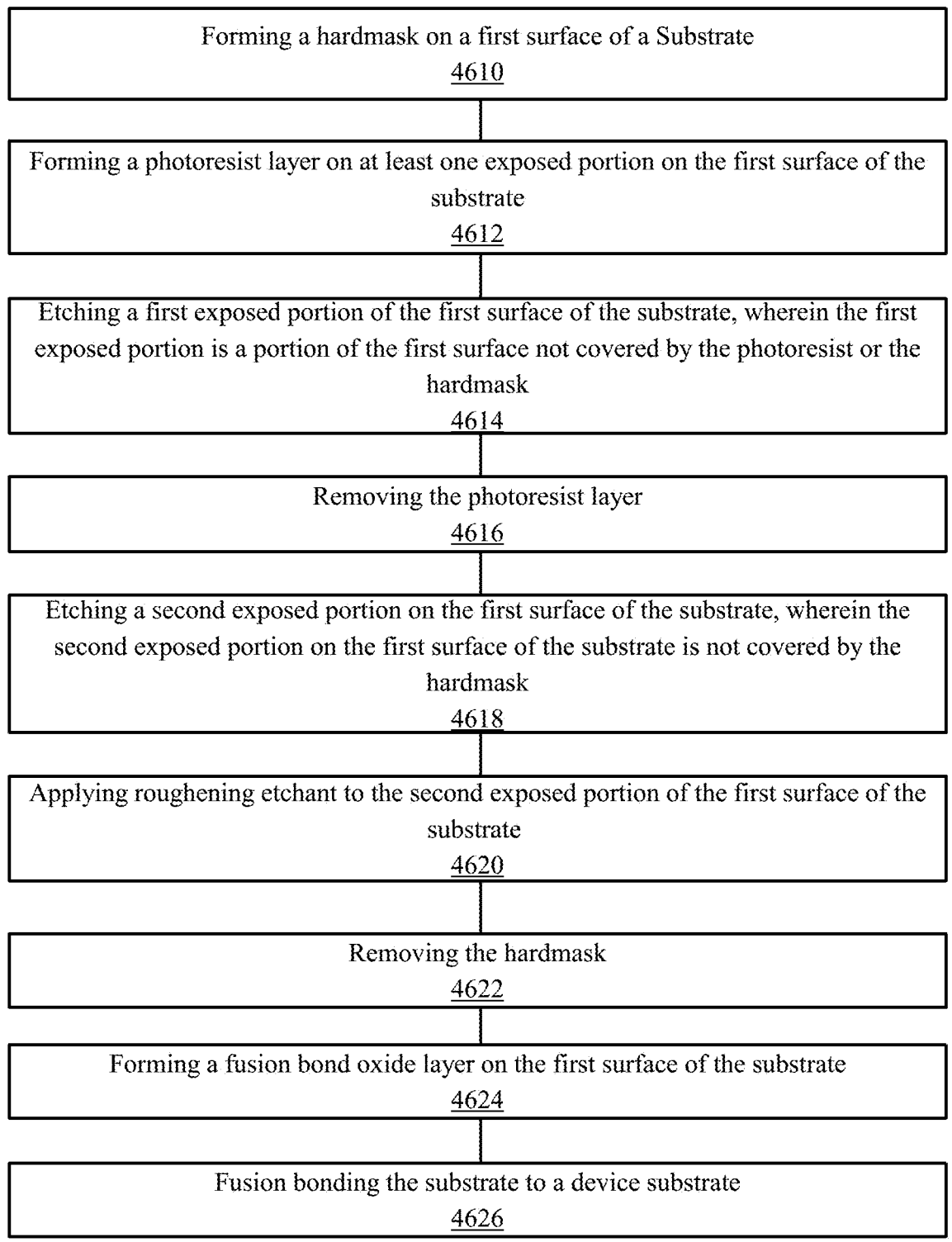
FIG. 46 shows a method of reducing stiction by applying roughening etchant to a first surface of a substrate according to one aspect of the present embodiments.

Referring now to FIG. 46, a method of reducing stiction by applying roughening etchant to a first surface of a substrate according to one aspect of the present embodiments is shown. The method steps described here have been described in FIGS. 7-15. At step 4610, a hardmask is formed on a first surface of a substrate. At step 4612, a photoresist layer is formed on at least one exposed portion on the first surface of the substrate. At step 4614, a first exposed portion of the first surface of the substrate is etched, in which the first exposed portion is a portion of the first surface not covered by the photoresist or the hardmask. At step 4616, the photoresist layer is removed. At step 4618, a second exposed portion is etched on the first surface of the substrate, in which the second exposed portion on the first surface of the substrate is not covered by the hardmask. At step 4620, roughening etchant is applied to the second exposed portion of the first surface of the substrate. At step 4622, the hardmask is removed. At step 4624, a fusion bond oxide layer is formed on the first surface of the substrate. At step 4626, the substrate is fusion bonded to a device substrate.

Figure 47A:
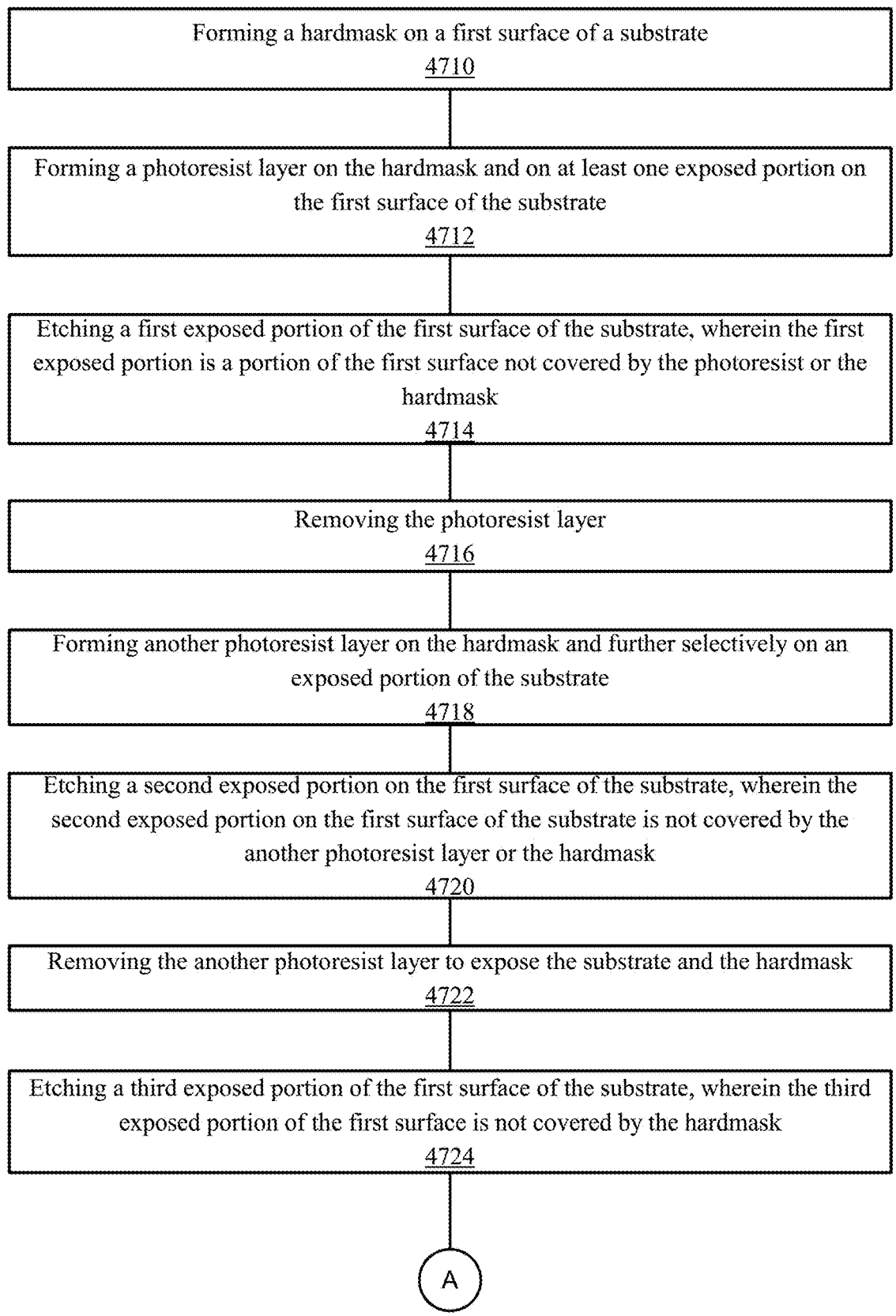
FIGS. 47A-47B show a method of reducing stiction of a MEMS device by reducing contact area between proof mass and an upper cavity surface according to one aspect of the present embodiments.
Figure 47B:
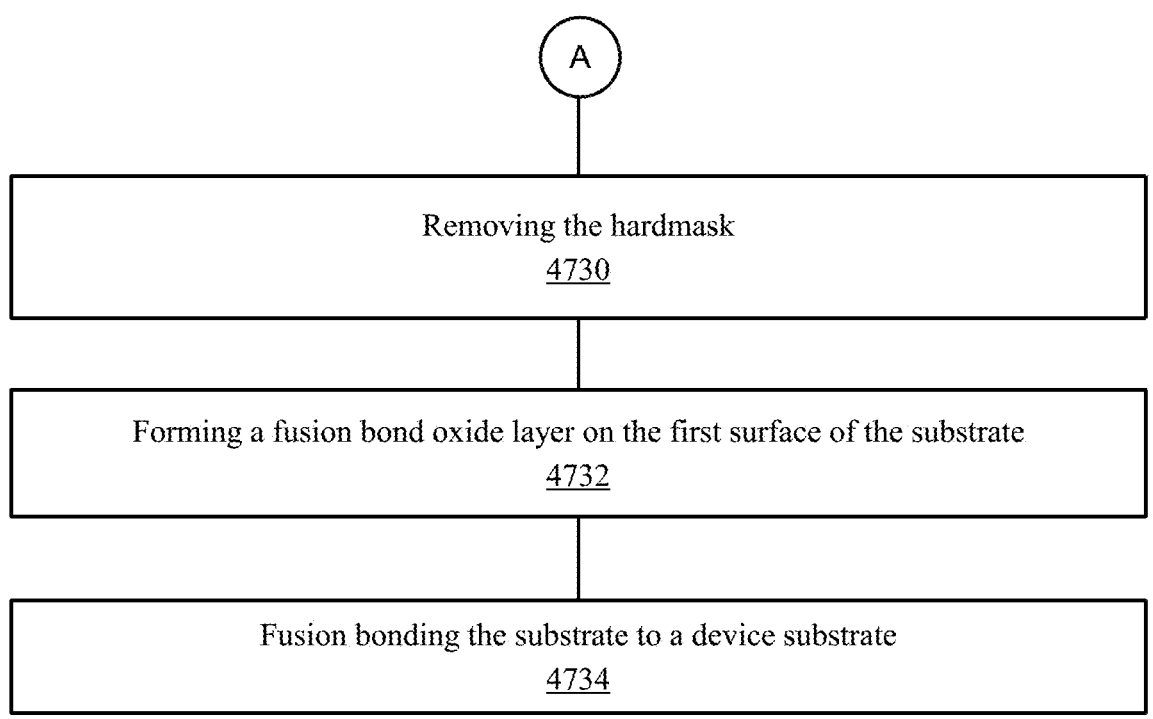

Referring now to FIGS. 47A-47B, a method of reducing stiction of a MEMS device by reducing contact area between proof mass and an upper cavity surface according to one aspect of the present embodiments is shown. The method steps described here have been described in FIGS. 16-24 and 27-34. At step 4710, a hardmask is formed on a first surface of a substrate. At step 4712, a photoresist layer is formed on the hardmask and on at least one exposed portion on the first surface of the substrate. At step 4714, a first exposed portion of the first surface of the substrate is etched, in which the first exposed portion is a portion of the first surface not covered by the photoresist or the hardmask. At step 4716, the photoresist layer is removed. At step 4718, another photoresist layer is formed on the hardmask and further selectively on an exposed portion of the substrate. At step 4720, a second exposed portion on the first surface of the substrate is etched, in which the second exposed portion on the first surface of the substrate is not covered by the another photoresist layer or the hardmask. At step 4722, the another photoresist layer is removed to expose the substrate and the hardmask. At step 4724, a third exposed portion of the first surface of the substrate is etched, in which the third exposed portion of the first surface is not covered by the hardmask. At step 4730, the hardmask is removed. At step 4732, a fusion bond oxide layer is formed on the first surface of the substrate. At step 4734, the substrate is fusion bonded to a device substrate.

Figure 47C:
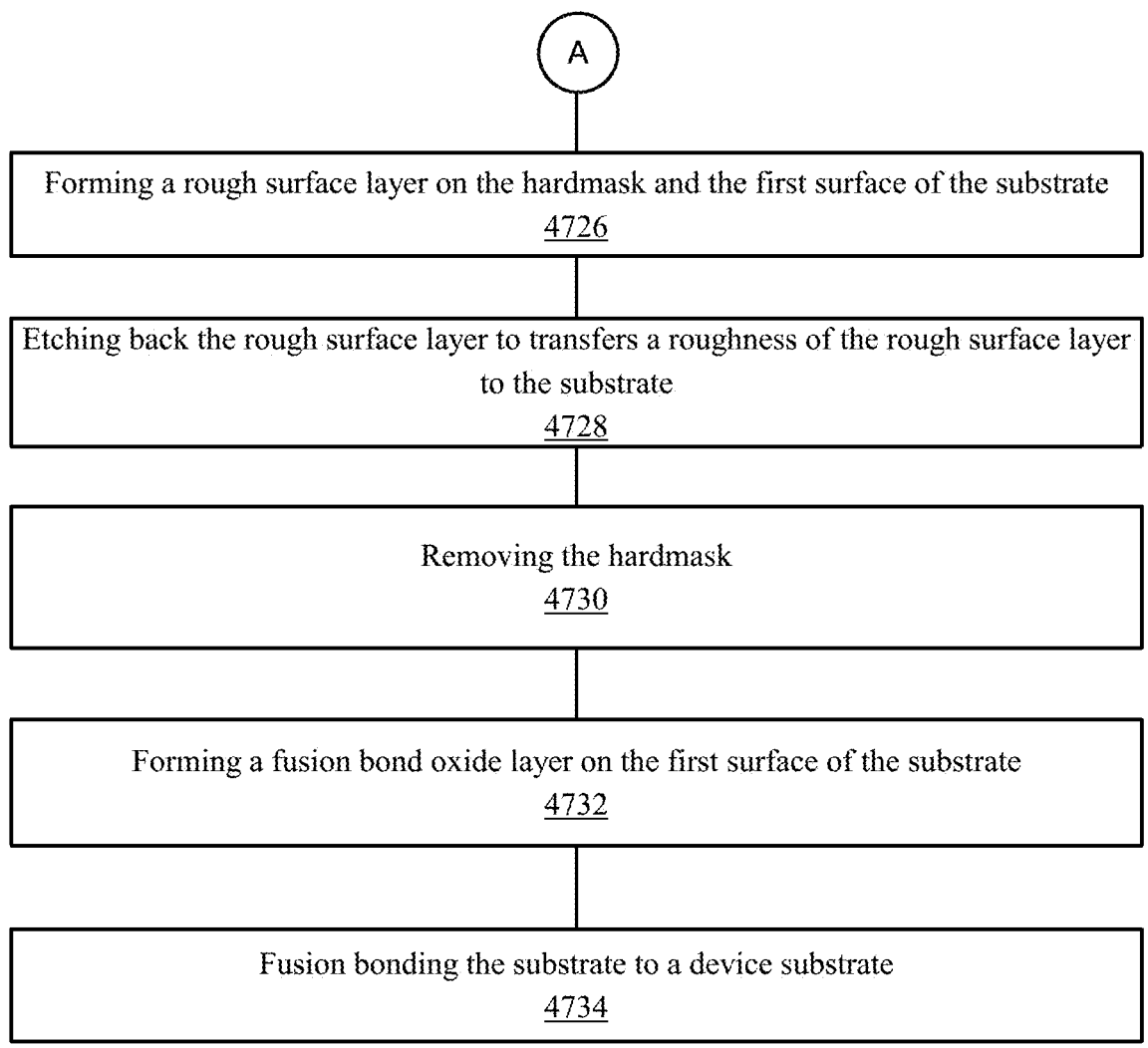
FIG. 47C, together with FIG. 47A, show an alternative method of reducing stiction of a MEMS device by reducing contact area between proof mass and upper cavity surface and increasing roughness of the upper cavity surface according to one aspect of the present embodiments.

Referring now to FIG. 47C, together with FIG. 47A, an alternative method of reducing stiction of a MEMS device by reducing contact area between proof mass and upper cavity surface and increasing roughness of the upper cavity surface according to one aspect of the present embodiments is shown. The method steps described here have been described in FIGS. 16-34. Steps 4710-24 and steps 4730-32 are substantially similar to that of FIGS. 47A-47B. In some embodiments, between steps 4724-30 there are two extra steps of depositing and etching back rough surface layer to transfer roughness to the surface of the substrate. At step 4726, a rough surface layer is formed on the hardmask and the first surface of the substrate. At step 4728, the rough surface layer is etched back to transfers a roughness of the rough surface layer to the substrate.

Figure 48:
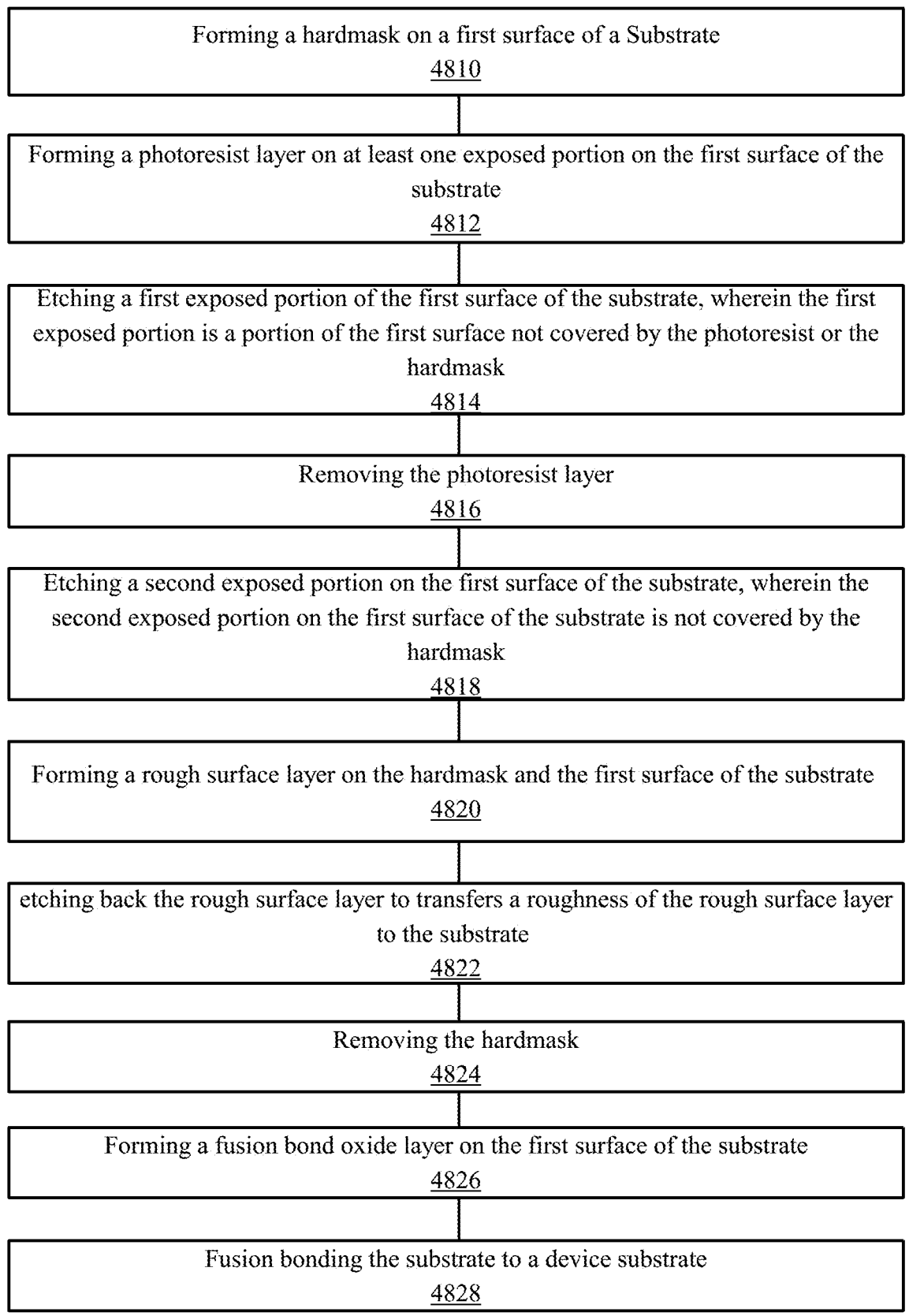
FIG. 48 shows a method of reducing stiction by depositing a rough layer to a surface of a substrate according to one aspect of the present embodiments.

Referring now to FIG. 48, a method of reducing stiction by depositing a rough layer to a surface of a substrate according to one aspect of the present embodiments is shown. The method steps described here have been described in FIGS. 35-44. At step 4810, a hardmask is formed on a first surface of a substrate. At step 4812, a photoresist layer is formed on at least one exposed portion on the first surface of the substrate. At step 4814, a first exposed portion of the first surface of the substrate is etched, in which the first exposed portion is a portion of the first surface not covered by the photoresist or the hardmask. At step 4816, the photoresist layer is removed. At step 4818, a second exposed portion is etched on the first surface of the substrate, in which the second exposed portion on the first surface of the substrate is not covered by the hardmask. At step 4820, a rough surface layer is formed on the hardmask and the first surface of the substrate. At step 4822, the rough surface layer is etched back to transfers a roughness of the rough surface layer to the substrate. At step 4824, the hardmask is removed. At step 4826, a fusion bond oxide layer is formed on the first surface of the substrate. At step 4828, the substrate is fusion bonded to a device substrate.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
    forming a hardmask on a first surface of a substrate;
    forming a photoresist layer on the hardmask and directly on at least one exposed portion on the first surface of the substrate, wherein a first portion of the substrate is exposed and uncovered by the hardmask or the photoresist mask;
    subsequent to the forming the hardmask and the forming the photoresist layer and prior to complete removal of the hardmask or the photoresist covering the first surface of the substrate or the at least one exposed portion on the first surface, etching the first exposed portion of the first surface of the substrate, wherein the first exposed portion is a portion of the first surface not covered by the photoresist or the hardmask;
    removing the photoresist layer;
    forming another photoresist layer on the hardmask and further selectively on an exposed portion of the substrate;
    subsequent to the removing the photoresist layer, etching a second exposed portion on the first surface of the substrate, wherein the second exposed portion on the first surface of the substrate is not covered by the another photoresist layer or the hardmask;
    removing the another photoresist layer to expose the substrate and the hardmask;
    etching a third exposed portion of the first surface of the substrate, wherein the third exposed portion of the first surface is not covered by the hardmask;
    forming a rough surface layer on the hardmask and the first surface of the substrate, wherein the rough surface layer increases roughness of the first surface of the substrate in comparison to the first surface of the substrate without the rough surface layer;
    etching back the rough surface layer to transfers a roughness of the rough surface layer to the substrate;
    subsequent to the forming the rough surface layer and subsequent to the etching back the rough surface layer, removing the hardmask;
    forming a fusion bond oxide layer on the first surface of the substrate; and
    fusion bonding the substrate to a device substrate.

2. The method of claim 1, wherein the rough surface layer comprises polysilicon.

3. The method of claim 1, wherein the etching back is more than a sum of a thickness of the rough surface layer and a thickness of the hardmask.

4. The method of claim 1, further comprising: before removing the hardmask applying roughening etchant to the third exposed portion of the first surface of the substrate.

5. The method of claim 1, wherein the device substrate comprises a MEMS accelerometer or a MEMS gyroscope.

6. The method of claim 1, further comprising forming a standoff on a surface of the device substrate opposite to a surface of the fusion bond.

7. A method comprising:
    forming a hardmask on a first surface of a substrate;
    forming a photoresist layer on at least one exposed portion on the first surface of the substrate;
    etching a first exposed portion of the first surface of the substrate, wherein the first exposed portion is a portion of the first surface not covered by the photoresist or the hardmask;
    removing the photoresist layer;
    etching a second exposed portion on the first surface of the substrate, wherein the second exposed portion on the first surface of the substrate is not covered by the hardmask;
    forming a rough surface layer on the hardmask and the first surface of the substrate, wherein the rough surface layer increases roughness of the first surface of the substrate in comparison to the first surface of the substrate without the rough surface layer;
    etching back the rough surface layer to transfers a roughness of the rough surface layer to the substrate;
    removing the hardmask;
    forming a fusion bond oxide layer on the first surface of the substrate; and
    fusion bonding the substrate to a device substrate.

8. The method of claim 7, wherein the rough surface layer comprises polysilicon.

9. The method of claim 7, wherein the etching back is more than a sum of a thickness of the rough surface layer and a thickness of the hardmask.

10. The method of claim 7, wherein the device substrate comprises a MEMS accelerometer or a MEMS gyroscope.

* * * * *